(12) United States Patent
Yoon et al.

(10) Patent No.: US 10,535,382 B2
(45) Date of Patent: Jan. 14, 2020

(54) SEMICONDUCTOR DEVICES

(71) Applicant: SK hynix Inc., Icheon-si Gyeonggi-do (KR)

(72) Inventors: Byung Kuk Yoon, Suwon-si (KR); Honggyeom Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/517,185

(22) Filed: Jul. 19, 2019

(65) Prior Publication Data
US 2019/0341086 A1 Nov. 7, 2019

Related U.S. Application Data

(62) Division of application No. 15/793,427, filed on Oct. 25, 2017, now Pat. No. 10,403,334.

(30) Foreign Application Priority Data

May 16, 2017 (KR) .................. 10-2017-0060640

(51) Int. Cl.
*G11C 7/10* (2006.01)
*G11C 7/22* (2006.01)

(52) U.S. Cl.
CPC ............ *G11C 7/1066* (2013.01); *G11C 7/106* (2013.01); *G11C 7/1045* (2013.01); *G11C 7/1087* (2013.01); *G11C 7/1093* (2013.01); *G11C 7/222* (2013.01); *G11C 2207/107* (2013.01)

(58) Field of Classification Search
None
See application file for complete search history.

(56) References Cited

U.S. PATENT DOCUMENTS

| 5,987,067 A | 11/1999 | Song |
| 2008/0181037 A1 | 7/2008 | Do et al. |
| 2010/0104057 A1 | 4/2010 | Nedovic et al. |
| 2015/0364176 A1* | 12/2015 | Lee ............ G06F 11/079 714/57 |
| 2018/0090186 A1* | 3/2018 | Kang ............ G11C 29/022 |

FOREIGN PATENT DOCUMENTS

KR 1020140052417 A 5/2014

* cited by examiner

*Primary Examiner* — Douglas King
(74) *Attorney, Agent, or Firm* — William Park & Associates Ltd.

(57) ABSTRACT

A semiconductor device includes a read mode signal generation circuit and a read alignment circuit. The read mode signal generation circuit compares a read command with at least one of internal clock signal to generate a read mode signal. The read alignment circuit is synchronized with the at least one internal clock signal to generate read data in response to internal data. The read alignment circuit controls an alignment sequence of the internal data in response to the read mode signal.

14 Claims, 18 Drawing Sheets

SEMICONDUCTOR DEVICES

CROSS-REFERENCE TO RELATED APPLICATION

The present application is a divisional application of U.S. patent application Ser. No. 15/793,427, filed on Oct. 25, 2017, and claims priority under 35 U.S.C 119(a) to Korean Application No. 10-2017-0060640, filed on May 16, 2017, which is incorporated herein by reference in its entirety.

BACKGROUND

1. Technical Field

Embodiments of the present disclosure relate to semiconductor devices aligning data to receive and output aligned data.

2. Related Art

As semiconductor systems are developed to operate at a high speed, high data transmission rates (or data communication at high bandwidth) between semiconductor devices included in each semiconductor system have been in increasing demand. In response to such a demand, various pre-fetch schemes have been proposed. The pre-fetch scheme may correspond to a design technique that latches data inputted in series and outputs the latched data in parallel. An internal clock divider may be used to obtain the parallel data. If an internal clock signal is divided, a plurality of multi-phase clock signals may be generated and the plurality of multi-phase clock signals may be used in parallelization or serialization of data.

SUMMARY

According to an embodiment, a semiconductor device includes a read mode signal generation circuit and a read alignment circuit. The read mode signal generation circuit compares a read command with at least one internal clock signal to generate a read mode signal. The read alignment circuit is synchronized with the at least one internal clock signal to generate read data in response to internal data. The read alignment circuit controls an alignment sequence of the internal data in response to the read mode signal.

According to another embodiment, a semiconductor device includes a write control circuit, a memory circuit, and a read control circuit. The write control circuit controls an alignment sequence of write data to generate internal data according to a comparison result of a write command and internal clock signals. The memory circuit stores the internal data during a write operation and outputs the internal data stored in the memory circuit during a read operation. The read control circuit controls an alignment sequence of the internal data to generate read data, according to a comparison result of a read command and the internal clock signals.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
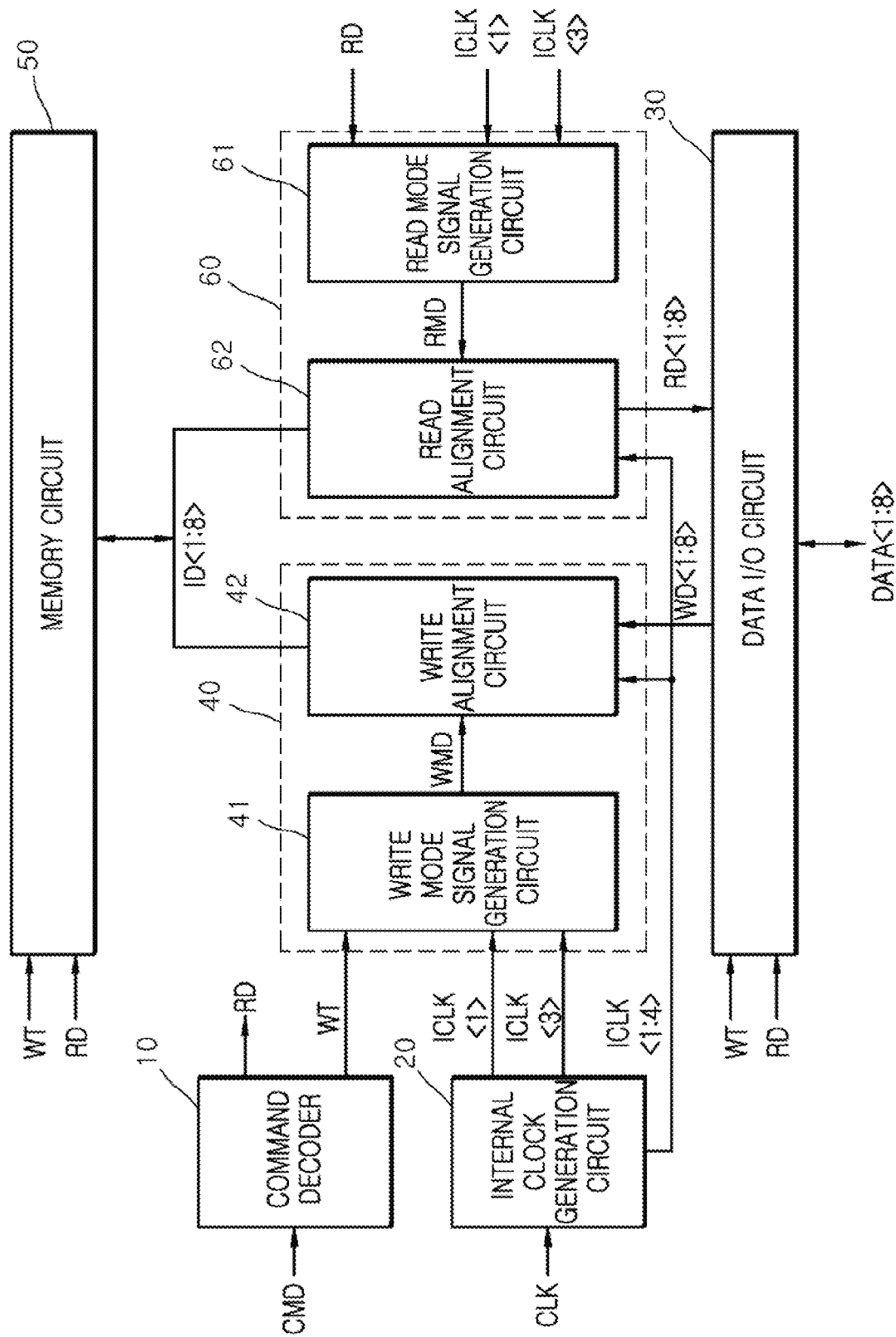
FIG. 1 is a block diagram illustrating a configuration of a semiconductor device according to an embodiment of the present disclosure.

As illustrated in FIG. 1, a semiconductor device according to an embodiment may include a command decoder 10, an internal clock generation circuit 20, a data input/output (I/O) circuit 30, a write control circuit 40, a memory circuit 50, and a read control circuit 60.

The command decoder 10 may decode an external command CMD to generate a write command WT and a read command RD. The external command CMD may be provided by an external device to control operations of the semiconductor device. The external command CMD may be transmitted through lines that transmit at least one group of addresses, commands, and data. Although FIG. 1 illustrates the external command CMD as a single signal, the external command CMD may be set to have a plurality of bits according to the embodiment.

The internal clock generation circuit 20 may generate internal clock signals which include first to fourth internal clock signals ICLK<1:4> in response to an external clock signal CLK. The internal clock generation circuit 20 may divide a frequency of the external clock signal CLK to generate the first to fourth internal clock signals ICLK<1:4> having different phases from each other. The external clock signal CLK may be a signal that is periodically toggled. The external clock signal CLK may be a signal for synchronizing operations of the semiconductor device. The first to fourth internal clock signals ICLK<1:4> may be obtained by dividing a frequency of the external clock signal CLK to have a phase difference of 90 degrees between the first to fourth internal clock signals ICLK<1:4>. The internal clock generation circuit 20 may be realized using any one of general frequency division circuits including a phase locked loop (PLL) circuit and a delay locked loop (DLL) circuit. Although FIG. 1 illustrates an example in which the internal clock generation circuit 20 generates the first to fourth internal clock signals ICLK<1:4> in response to the external clock signal CLK, the present disclosure is not limited thereto. For example, the amount of internal clock signals generated by the internal clock generation circuit 20 may be set to be different according to the embodiment.

The data I/O circuit 30 may receive first to eighth data DATA<1:8> to generate first to eighth write data WD<1:8> during a write operation. The data I/O circuit 30 may output the first to eighth data DATA<1:8> as the first to eighth write data WD<1:8> in response to the write command WT. The data I/O circuit 30 may receive first to eighth read data RD<1:8> to generate the first to eighth data DATA<1:8> during a read operation. The data I/O circuit 30 may output the first to eighth read data RD<1:8> as the first to eighth data DATA<1:8> in response to the read command RD. The first to eighth data DATA<1:8> may be set to be data which is inputted to the semiconductor device from an external device or which is outputted from the semiconductor device toward the external device. The first to eighth write data WD<1:8> may include a plurality of bits and may be serial data which is sequentially generated through the plurality of bits. Although FIG. 1 illustrates an example in which the data I/O circuit 30 receives or outputs the first to eighth data DATA<1:8>, the present disclosure is not limited thereto. For example, the amount of data inputted to or outputted from the data I/O circuit 30 may be set to be different according to the embodiment.

The write control circuit 40 may include a write mode signal generation circuit 41 and a write alignment circuit 42.

The write mode signal generation circuit 41 may compare the write command WT with at least one of the first to fourth internal clock signals ICLK<1:4> to generate a write mode signal WMD. The write mode signal generation circuit 41 may compare an input time of the write command WT with generation times of the first to fourth internal clock signals ICLK<1:4> to generate the write mode signal WMD. The write mode signal generation circuit 41 may compare the input time of the write command WT with the generation times of the first internal clock signal ICLK<1> and the third internal clock signal ICLK<3> to generate the write mode signal WMD. The write mode signal WMD may be set to be enabled if the write command WT is inputted to the write mode signal generation circuit 41 at a time that the third internal clock signal ICLK<3> is generated. A logic level of the enabled write mode signal WMD may be set to be different according to the embodiment.

The write alignment circuit 42 may be synchronized with the first to fourth internal clock signals ICLK<1:4> to generate first to eighth internal data ID<1:8> in response to the first to eighth write data WD<1:8>. The write alignment circuit 42 may be synchronized with the first to fourth internal clock signals ICLK<1:4> to output the first to eighth write data WD<1:8> as the first to eighth internal data ID<1:8>. The write alignment circuit 42 may align the first to eighth write data WD<1:8> in a predetermined sequence in synchronization with the first to fourth internal clock signals ICLK<1:4> to generate the first to eighth internal data ID<1:8>, if the write mode signal WMD is enabled. The write alignment circuit 42 may output the first to eighth write data WD<1:8> as the first to eighth internal data ID<1:8> without aligning the first to eighth write data WD<1:8> in synchronization with the first to fourth internal clock signals ICLK<1:4>, if the write mode signal WMD is disabled. The first to eighth internal data ID<1:8> may be simultaneously generated in parallel. Although FIG. 1 illustrates an example in which the write alignment circuit 42 generates the first to eighth internal data ID<1:8>, the present disclosure is not limited thereto. For example, the amount of internal data generated by the write alignment circuit 42 may be less than or greater than eight according to the embodiment.

As described above, the write control circuit 40 may compare the write command WT with the first to fourth internal clock signals ICLK<1:4> and may control an alignment sequence of the first to eighth write data WD<1:8> to generate and output the aligned first to eighth write data WD<1:8> or the non-aligned first to eighth write data WD<1:8> as the first to eighth internal data ID<1:8> according to the comparison result. The write control circuit 40 may control an alignment sequence of the first to eighth write data WD<1:8> to output the aligned first to eighth write data WD<1:8> or the non-aligned first to eighth write data WD<1:8> as the first to eighth internal data ID<1:8> according to a difference between the input time of the write command WT and the generation times of the first to fourth internal clock signals ICLK<1:4>. More specifically, the write control circuit 40 may align the first to eighth write data WD<1:8> in a predetermined sequence to output the aligned first to eighth write data WD<1:8> as the first to eighth internal data ID<1:8> if the write command WT is inputted when the third internal clock signal ICLK<3> is generated.

The memory circuit 50 may store the first to eighth internal data ID<1:8> therein during the write operation. The memory circuit 50 may store the first to eighth internal data ID<1:8> therein in response to the write command WT. The memory circuit 50 may output the first to eighth internal data ID<1:8>, which are stored therein, during the read operation if the read operation is performed. The memory circuit 50 may output the first to eighth internal data ID<1:8>, which are stored therein, in response to the read command RD. The memory circuit 50 may be realized using a volatile memory circuit including a plurality of volatile memory cells or a nonvolatile memory circuit including a plurality of nonvolatile memory cells. Although FIG. 1 illustrates an example in which the memory circuit 50 receives or outputs the first to eighth internal data ID<1:8> at a certain time, the present disclosure is not limited thereto. For example, the amount of internal data inputted to or outputted from the memory circuit 50 at a certain time may be set to be less than or greater than eight according to the embodiments.

The read control circuit 60 may include a read mode signal generation circuit 61 and a read alignment circuit 62.

The read mode signal generation circuit 61 may compare the read command RD with at least one of the first to fourth internal clock signals ICLK<1:4> to generate a read mode signal RMD. The read mode signal generation circuit 61 may compare an input time of the read command RD with generation times of the first to fourth internal clock signals ICLK<1:4> to generate the read mode signal RMD. The read mode signal generation circuit 61 may compare the input time of the read command RD with the generation times of the first internal clock signal ICLK<1> and the third internal clock signal ICLK<3> to generate the read mode signal RMD. The read mode signal RMD may be set to be enabled if the read command RD is inputted to the read mode signal generation circuit 61 at a time that the third internal clock signal ICLK<3> is generated. A logic level of the enabled read mode signal RMD may be set to be different according to the embodiment.

The read alignment circuit 62 may be synchronized with the first to fourth internal clock signals ICLK<1:4> to generate first to eighth read data RD<1:8> in response to the first to eighth internal data ID<1:8>. The read alignment circuit 62 may be synchronized with the first to fourth internal clock signals ICLK<1:4> to output the first to eighth internal data ID<1:8> as the first to eighth read data RD<1:8>. The read alignment circuit 62 may align the first to eighth internal data ID<1:8> in a predetermined sequence in synchronization with the first to fourth internal clock signals ICLK<1:4> to generate the first to eighth read data RD<1:8>, if the read mode signal RMD is enabled. The read alignment circuit 62 may output the first to eighth internal data ID<1:8> as the first to eighth read data RD<1:8> without aligning the first to eighth internal data ID<1:8> in synchronization with the first to fourth internal clock signals ICLK<1:4>, if the read mode signal RMD is disabled. The first to eighth read data RD<1:8> may be simultaneously generated in parallel. Although FIG. 1 illustrates an example in which the read alignment circuit 62 generates the first to eighth read data RD<1:8>, the present disclosure is not limited thereto. For example, the amount of read data generated by the read alignment circuit 62 may be less than or greater than eight according to the embodiment.

As described above, the read control circuit 60 may control an alignment sequence of the first to eighth internal data ID<1:8> to generate and output the aligned first to eighth internal data ID<1:8> or the non-aligned first to eighth internal data ID<1:8> as the first to eighth read data RD<1:8> according to a difference between the input time of the read command RD and the generation times of the first to fourth internal clock signals ICLK<1:4>. Specifically, the read control circuit 60 may align the first to eighth internal data ID<1:8> in a predetermined sequence to output the aligned internal data as the first to eighth read data RD<1:8> if the read command RD is inputted when the third internal clock signal ICLK<3> is generated.

Figure 2:
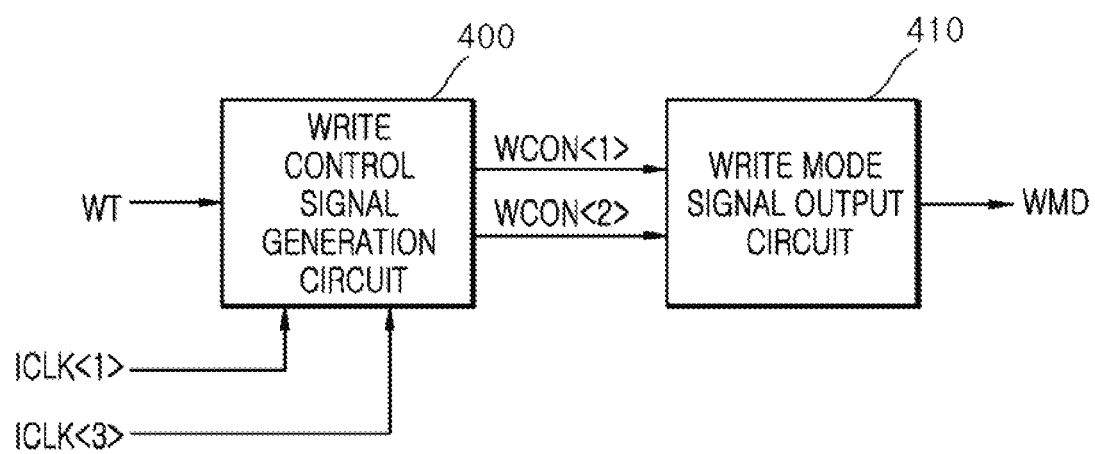
FIG. 2 is a block diagram illustrating a configuration of a write mode signal generation circuit included in the semiconductor device of FIG. 1.

Referring to FIG. 2, the write mode signal generation circuit 41 may include a write control signal generation circuit 400 and a write mode signal output circuit 410.

The write control signal generation circuit 400 may compare the input time of the write command WT with the generation times of the first internal clock signal ICLK<1> and the third internal clock signal ICLK<3> to generate a first write control signal WCON<1> and a second write control signal WCON<2>. The write control signal generation circuit 400 may compare the input time of the write command WT with the generation time of the first internal clock signal ICLK<1> to generate the first write control signal WCON<1>. The write control signal generation circuit 400 may generate the first write control signal WCON<1> which is enabled if the write command WT is inputted to the write control signal generation circuit 400 at a time that the first internal clock signal ICLK<1> is generated. The write control signal generation circuit 400 may compare the input time of the write command WT with the generation time of the third internal clock signal ICLK<3> to generate the second write control signal WCON<2>. The write control signal generation circuit 400 may generate the second write control signal WCON<2> which is enabled if the write command WT is inputted to the write control signal generation circuit 400 at a time that the third internal clock signal ICLK<3> is generated. Logic levels of the first and second write control signals WCON<1:2>, which are enabled, may be set to be different according to the embodiment.

The write mode signal output circuit 410 may generate the write mode signal WMD in response to the first and second write control signals WCON<1:2>. The write mode signal output circuit 410 may generate the write mode signal WMD which is enabled if the second write control signal WCON<2> is enabled. The write mode signal output circuit 410 may generate the write mode signal WMD which is disabled if the first write control signal WCON<1> is enabled.

Figure 3:
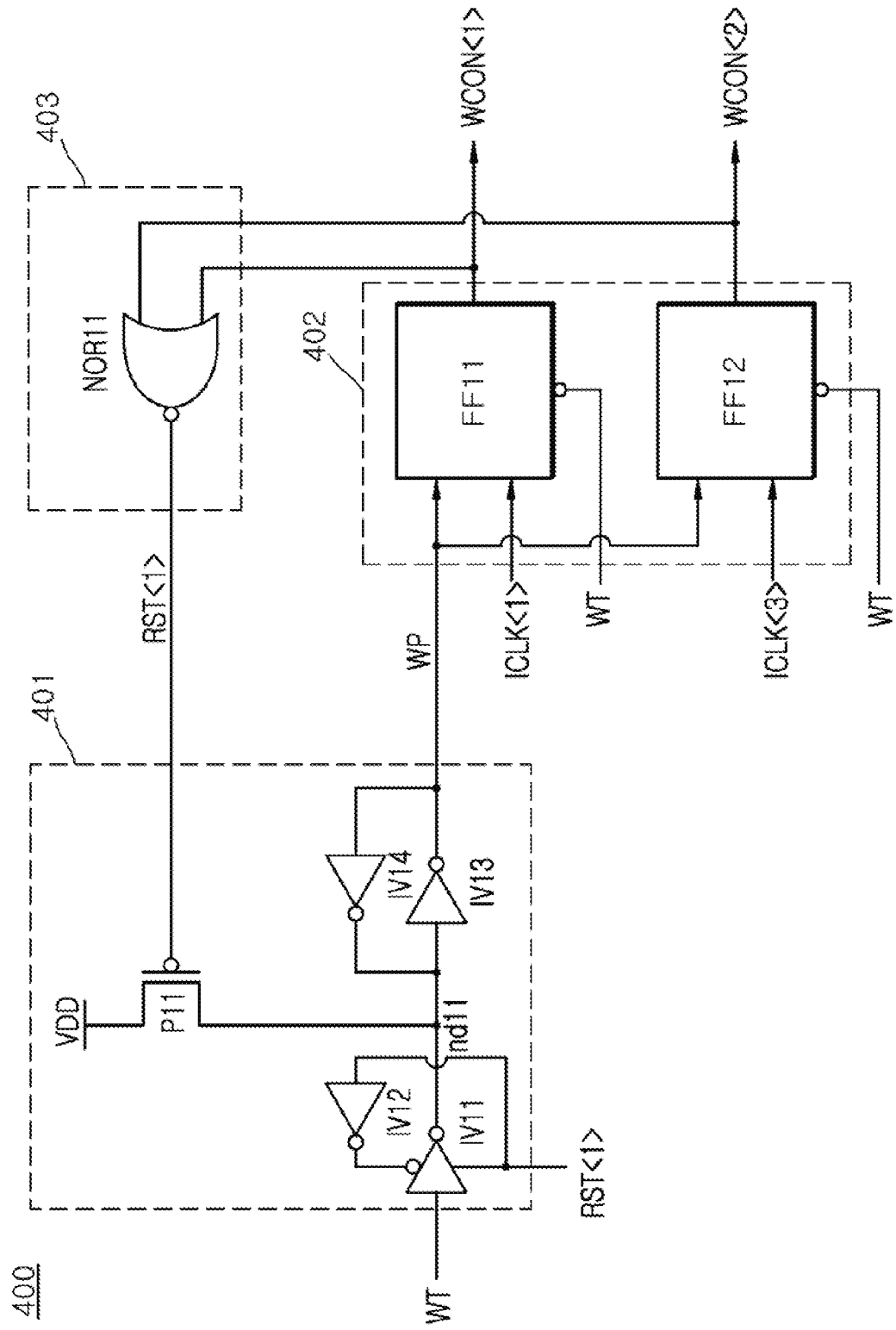
FIG. 3 is a circuit diagram illustrating a configuration of a write control signal generation circuit included in the write mode signal generation circuit of FIG. 2.

Referring to FIG. 3, the write control signal generation circuit 400 may include a write pulse generation circuit 401, a first phase comparison circuit 402, and a first reset signal generation circuit 403.

The write pulse generation circuit 401 may be configured to include inverters IV11, IV12, IV13, and IV14 and a PMOS transistor P11. The PMOS transistor P11 may be coupled between a power supply voltage VDD terminal and a node nd11, and a first reset signal RST<1> may be applied to a gate of the PMOS transistor P11. The write pulse generation circuit 401 may generate a write pulse WP which is initialized in response to the first reset signal RST<1>. If the first reset signal RST<1> is enabled to have a logic "low" level, the PMOS transistor P11 may be turned on to drive the node nd11 to a level of the power supply voltage VDD, and a latch circuit comprised of the inverters IV13 and IV14 may inversely buffer a signal of the node nd11 to generate the write pulse WP which is initialized to have a logic "low" level. The inverter IV11 may inversely buffer the write command WT to output the inversely buffered write command to the node nd11. The inverter IV11 may be realized using a three-phase inverter which is turned on or off according to the first reset signal RST<1>. The write pulse generation circuit 401 may generate the write pulse WP which is created during a predetermined period in response to the first reset signal RST<1> at a time that the write command WT is inputted to the inverter IV11. The write pulse generation circuit 401 may generate the write pulse WP which is created during a predetermined period at a time that the write command WT is inputted to the inverter IV11, if the first reset signal RST<1> is disabled to have a logic "high" level. Although FIG. 3 illustrates an example in which the inverter IV11 is realized using a three-phase inverter, the present disclosure is not limited thereto. For example, the inverter IV11 may be realized using a transfer gate comprised of transistors according to the embodiment.

The first phase comparison circuit 402 may be realized using flip-flops FF11 and FF12. The flip-flop FF11 may generate the first write control signal WCON<1> which is initialized if the write command WT is not inputted thereto. That is, the flip-flop FF11 may generate the first write control signal WCON<1> which is initialized to have a logic "low" level if the write command WT having a logic "low" level is inputted to the flip-flop FF11. The flip-flop FF11 may latch the write pulse WP to generate the first write control signal WCON<1> during a period that the first internal clock signal ICLK<1> is generated. The flip-flop FF11 may generate the first write control signal WCON<1> which is enabled to have a logic "high" level if the write pulse WP having a logic "high" level is inputted to the flip-flop FF11 during a period that the first internal clock signal ICLK<1> is generated. The flip-flop FF12 may generate the second write control signal WCON<2> which is initialized if the write command WT is not inputted thereto. That is, the flip-flop FF12 may generate the second write control signal WCON<2> which is initialized to have a logic "low" level if the write command WT having a logic "low" level is inputted to the flip-flop FF12. The flip-flop FF12 may latch the write pulse WP to generate the second write control signal WCON<2> during a period that the third internal clock signal ICLK<3> is generated. The flip-flop FF12 may generate the second write control signal WCON<2> which is enabled to have a logic "high" level if the write pulse WP having a logic "high" level is inputted to the flip-flop FF12 during a period that the third internal clock signal ICLK<3> is generated.

The first reset signal generation circuit 403 may be realized using a NOR gate NOR11. The first reset signal generation circuit 403 may perform a NOR operation of the first write control signal WCON<1> and the second write control signal WCON<2> to generate the first reset signal RST<1>. The first reset signal generation circuit 403 may generate the first reset signal RST<1> which is enabled to have a logic "low" level if at least one of the first and second write control signals WCON<1:2> has a logic "high" level. The first reset signal generation circuit 403 may generate the first reset signal RST<1> which is disabled to have a logic "high" level if both of the first and second write control signals WCON<1:2> has a logic "low" level.

Figure 4:
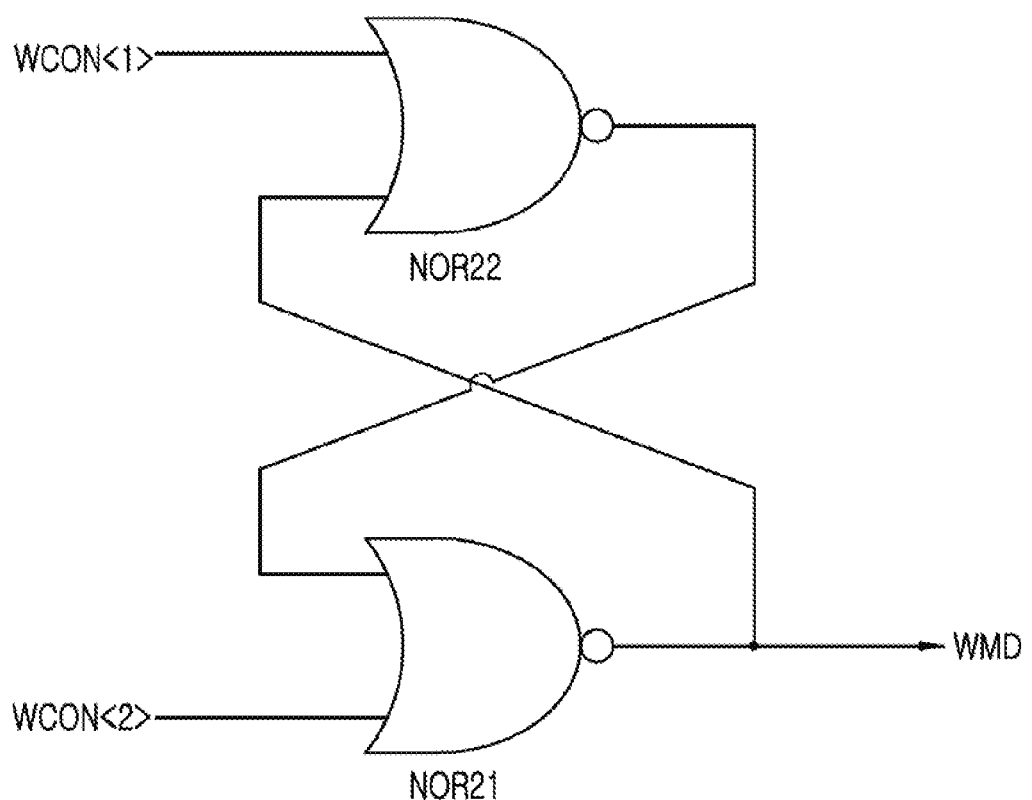
FIG. 4 is a circuit diagram illustrating a configuration of a write mode signal output circuit included in the write mode signal generation circuit of FIG. 2.

Referring to FIG. 4, the write mode signal output circuit 410 may be realized using an SR-latch circuit which is comprised of NOR gates NOR21 and NOR22.

The write mode signal output circuit 410 may generate the write mode signal WMD which is enabled in response to the second write control signal WCON<2>. The write mode signal output circuit 410 may generate the write mode signal WMD which is enabled to have a logic "low" level if the second write control signal WCON<2> has a logic "high" level. The write mode signal output circuit 410 may generate the write mode signal WMD which is disabled in response to the first write control signal WCON<1>. The write mode signal output circuit 410 may generate the write mode signal WMD which is disabled to have a logic "high" level if the first write control signal WCON<1> has a logic "high" level.

Figure 5:
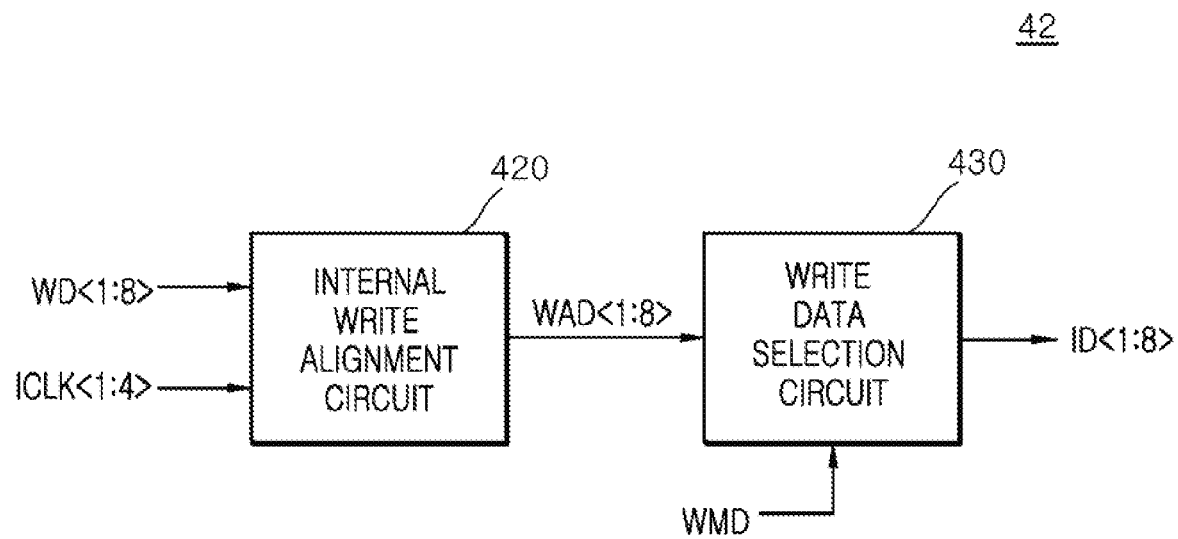
FIG. 5 is a block diagram illustrating a configuration of a write alignment circuit included in the semiconductor device of FIG. 1.

Referring to FIG. 5, the write alignment circuit 42 may include an internal write alignment circuit 420 and a write data selection circuit 430.

The internal write alignment circuit 420 may align the first to eighth write data WD<1:8> in a predetermined sequence in synchronization with the first to fourth internal clock signals ICLK<1:4> to generate first to eighth write alignment data WAD<1:8>. Although FIG. 5 illustrates an example in which the internal write alignment circuit 420 generates the first to eighth write alignment data WAD<1:8>, the present disclosure is not limited thereto. For example, the amount of the write alignment data generated by the internal write alignment circuit 420 may be set to be less than or greater than eight according to the embodiment. A configuration and an operation of the internal write alignment circuit 420 generating the first to eighth write alignment data WAD<1:8> will be described more fully with reference to FIGS. 6, 8, and 9 later.

The write data selection circuit 430 may selectively output the first to eighth write alignment data WAD<1:8> as the first to eighth internal data ID<1:8> in response to the write mode signal WMD. Although FIG. 5 illustrates an example in which the write data selection circuit 430 generates the first to eighth internal data ID<1:8>, the present disclosure is not limited thereto. For example, the amount of internal data generated by the write data selection circuit 430 may be set to be less than or greater than eight according to the embodiment. A configuration and an operation of the write data selection circuit 430 generating the first to eighth internal data ID<1:8> will later be more fully described with reference to FIGS. 7, 8, and 9.

Figure 6:
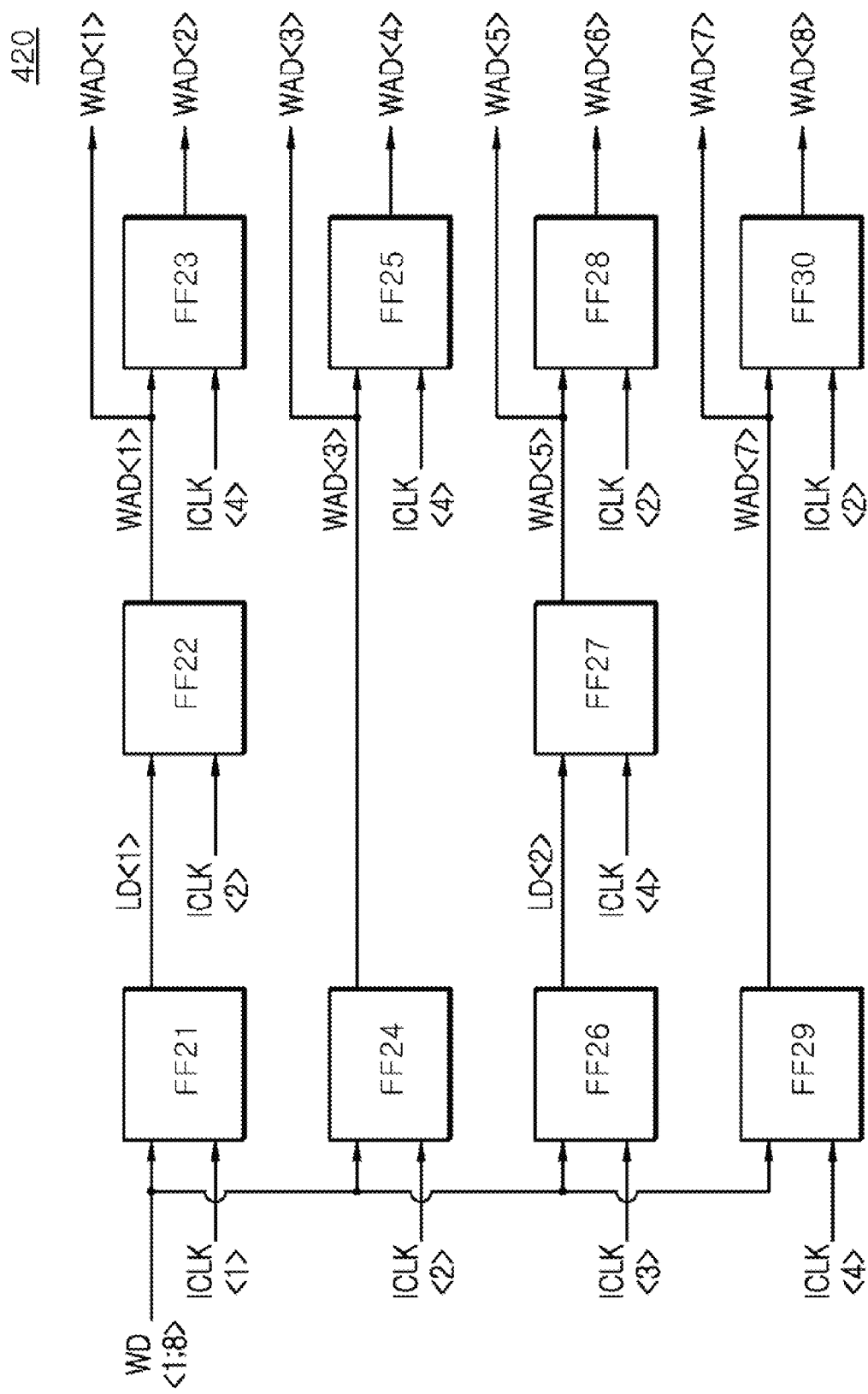
FIG. 6 is a block diagram illustrating a configuration of an internal write alignment circuit included in the write alignment circuit of FIG. 5.

Referring to FIG. 6, the internal write alignment circuit 420 may be realized using flip-flops FF21, FF22, FF23, FF24, FF25, FF26, FF27, FF28, FF29, and FF30.

The flip-flop FF21 may latch the write data among the first to eighth write data WD<1:8>, which is inputted in synchronization with rising edges of the first internal clock signal ICLK<1>. The flip-flop FF21 may output the write data, which is latched in synchronization with rising edges of the first internal clock signal ICLK<1>, as first latched data LD<1>. The flip-flop FF21 may latch any one write datum among the first to eighth write data WD<1:8>, which is inputted in synchronization with a first rising edge of the first internal clock signal ICLK<1>, to generate a first datum bit of the first latched data LD<1>. The flip-flop FF21 may latch any one write datum among the first to eighth write data WD<1:8>, which is inputted in synchronization with a second rising edge of the first internal clock signal ICLK<1>, to generate a second datum bit of the first latched data LD<1>. In an embodiment, the first latched data LD<1> may be generated to include two-bits of write data among the first to eighth write data WD<1:8> if a rising edge of the first internal clock signal ICLK<1> is created twice while the first to eighth write data WD<1:8> is inputted to the flip-flop FF21.

The flip-flop FF22 may latch the first latched data LD<1>, which is inputted in synchronization with rising edges of the second internal clock signal ICLK<2>, among the first latched data LD<1>. The flip-flop FF22 may output the first latched data LD<1>, which is latched in synchronization with rising edges of the second internal clock signal ICLK<2>, as the first write alignment data WAD<1>. In an embodiment, the first write alignment data WAD<1> may be generated to include two-bits of data of the first latched data LD<1> if a rising edge of the second internal clock signal ICLK<2> is created twice while the first latched data LD<1> is inputted to the flip-flop FF22. The flip-flop FF22 may latch a first datum of the first latched data LD<1> in synchronization with a first rising edge of the second internal clock signal ICLK<2> to generate a first datum bit of the first write alignment data WAD<1>. The flip-flop FF22 may latch a second datum of the first latched data LD<1> in synchronization with a second rising edge of the second internal clock signal ICLK<2> to generate a second datum bit of the first write alignment data WAD<1>.

The flip-flop FF23 may latch the first write alignment data WAD<1>, which is inputted in synchronization with rising edges of the fourth internal clock signal ICLK<4>, among the first write alignment data WAD<1>. The flip-flop FF23 may output the first write alignment data WAD<1>, which is latched in synchronization with rising edges of the fourth internal clock signal ICLK<4>, as the second write alignment data WAD<2>. In an embodiment, the second write alignment data WAD<2> may be generated to include two-bits of data of the first write alignment data WAD<1> if a rising edge of the fourth internal clock signal ICLK<4> is created twice while the first write alignment data WAD<1> is inputted to the flip-flop FF23. The flip-flop FF23 may latch a first datum of the first write alignment data WAD<1> in synchronization with a first rising edge of the fourth internal clock signal ICLK<4> to generate a first datum bit of the second write alignment data WAD<2>. The flip-flop FF23 may latch a second datum of the first write alignment data WAD<1> in synchronization with a second rising edge of the fourth internal clock signal ICLK<4> to generate a second datum bit of the second write alignment data WAD<2>.

The flip-flop FF24 may latch the write data among the first to eighth write data WD<1:8>, which is inputted in synchronization with rising edges of the second internal clock signal ICLK<2>. The flip-flop FF24 may output the write data as the third write alignment data WAD<3>, which is latched in synchronization with rising edges of the second internal clock signal ICLK<2>. In an embodiment, the third write alignment data WAD<3> may be generated to include two-bits of write data among the first to eighth write data WD<1:8> if a rising edge of the second internal clock signal ICLK<2> is created twice while the first to eighth write data WD<1:8> is inputted to the flip-flop FF24. The flip-flop FF24 may latch any one write datum among the first to eighth write data WD<1:8>, which is inputted in synchronization with a first rising edge of the second internal clock signal ICLK<2>, to generate a first datum bit of the third write alignment data WAD<3>. The flip-flop FF24 may latch any one write datum among the first to eighth write data WD<1:8>, which is inputted in synchronization with a second rising edge of the second internal clock signal ICLK<2>, to generate a second datum bit of the third write alignment data WAD<3>.

The flip-flop FF25 may latch the third write alignment data WAD<3>, which is inputted in synchronization with rising edges of the fourth internal clock signal ICLK<4>, among the third write alignment data WAD<3>. The flip-flop FF25 may output the third write alignment data WAD<3>, which is latched in synchronization with rising edges of the fourth internal clock signal ICLK<4>, as the fourth write alignment data WAD<4>. In an embodiment, the fourth write alignment data WAD<4> may be generated to include two-bits of data of the third write alignment data WAD<3> if a rising edge of the fourth internal clock signal ICLK<4> is created twice while the third write alignment data WAD<3> is inputted to the flip-flop FF25. The flip-flop FF25 may latch a first datum of the third write alignment data WAD<3> in synchronization with a first rising edge of the fourth internal clock signal ICLK<4> to generate a first datum bit of the fourth write alignment data WAD<4>. The flip-flop FF25 may latch a second datum of the third write alignment data WAD<3> in synchronization with a second rising edge of the fourth internal clock signal ICLK<4> to generate a second datum bit of the fourth write alignment data WAD<4>.

The flip-flop FF26 may latch the write data, which is inputted in synchronization with rising edges of the third internal clock signal ICLK<3>, among the first to eighth write data WD<1:8>. The flip-flop FF26 may output the write data, which is latched in synchronization with rising edges of the third internal clock signal ICLK<3>, as second latched data LD<2>. In an embodiment, the second latched data LD<2> may be generated to include two-bits of write data among the first to eighth write data WD<1:8> if a rising edge of the third internal clock signal ICLK<3> is created twice while the first to eighth write data WD<1:8> is inputted to the flip-flop FF26. The flip-flop FF26 may latch any one write datum among the first to eighth write data WD<1:8>, which is inputted in synchronization with a first rising edge of the third internal clock signal ICLK<3>, to generate a first datum bit of the second latched data LD<2>. The flip-flop FF26 may latch any one write datum among the first to eighth write data WD<1:8>, which is inputted in synchronization with a second rising edge of the third internal clock signal ICLK<3>, to generate a second datum bit of the second latched data LD<2>.

The flip-flop FF27 may latch the second latched data LD<2>, which are inputted in synchronization with rising edges of the fourth internal clock signal ICLK<4>, among the second latched data LD<2>. The flip-flop FF27 may output the second latched data LD<2>, which is latched in synchronization with rising edges of the fourth internal clock signal ICLK<4>, as the fifth write alignment data WAD<5>. In an embodiment, the fifth write alignment data WAD<5> may be generated to include two-bits of data of the second latched data LD<2> if a rising edge of the fourth internal clock signal ICLK<4> is created twice while the second latched data LD<2> is inputted to the flip-flop FF27. The flip-flop FF27 may latch a first datum of the second latched data LD<2> in synchronization with a first rising edge of the fourth internal clock signal ICLK<4> to generate a first datum bit of the fifth write alignment data WAD<5>. The flip-flop FF27 may latch a second datum of the second latched data LD<2> in synchronization with a second rising edge of the fourth internal clock signal ICLK<4> to generate a second datum bit of the fifth write alignment data WAD<5>.

The flip-flop FF28 may latch the fifth write alignment data WAD<5>, which is inputted in synchronization with rising edges of the second internal clock signal ICLK<2>, among the fifth write alignment data WAD<5>. The flip-flop FF28 may output the fifth write alignment data WAD<5>, which is latched in synchronization with rising edges of the second internal clock signal ICLK<2>, as the sixth write alignment data WAD<6>. In an embodiment, the sixth write alignment data WAD<6> may be generated to include two-bits of data of the fifth write alignment data WAD<5> if a rising edge of the second internal clock signal ICLK<2> is created twice while the fifth write alignment data WAD<5> is inputted to the flip-flop FF28. The flip-flop FF28 may latch a first datum of the fifth write alignment data WAD<5> in synchronization with a first rising edge of the second internal clock signal ICLK<2> to generate a first datum bit of the sixth write alignment data WAD<6>. The flip-flop FF28 may latch a second datum of the fifth write alignment data WAD<5> in synchronization with a second rising edge of the second internal clock signal ICLK<2> to generate a second datum bit of the sixth write alignment data WAD<6>.

The flip-flop FF29 may latch the write data among the first to eighth write data WD<1:8>, which is inputted in synchronization with rising edges of the fourth internal clock signal ICLK<4>. The flip-flop FF29 may output the write data, which is latched in synchronization with rising edges of the fourth internal clock signal ICLK<4>, as the seventh write alignment data WAD<7>. In an embodiment, the seventh write alignment data WAD<7> may be generated to include two-bits of write data among the first to eighth write data WD<1:8> if a rising edge of the fourth internal clock signal ICLK<4> is created twice while the first to eighth write data WD<1:8> is inputted to the flip-flop FF29. The flip-flop FF29 may latch any one write datum among the first to eighth write data WD<1:8>, which is inputted in synchronization with a first rising edge of the fourth internal clock signal ICLK<4>, to generate a first datum bit of the seventh write alignment data WAD<7>. The flip-flop FF29 may latch any one write datum among the first to eighth write data WD<1:8>, which is inputted in synchronization with a second rising edge of the fourth internal clock signal ICLK<4>, to generate a second datum bit of the seventh write alignment data WAD<7>.

The flip-flop FF30 may latch the seventh write alignment data WAD<7>, which is inputted in synchronization with rising edges of the second internal clock signal ICLK<2>, among the seventh write alignment data WAD<7>. The flip-flop FF30 may output the seventh write alignment data WAD<7>, which is latched in synchronization with rising edges of the second internal clock signal ICLK<2>, as the eighth write alignment data WAD<8>. In an embodiment, the eighth write alignment data WAD<8> may be generated to include two-bits of data of the seventh write alignment data WAD<7> if a rising edge of the second internal clock signal ICLK<2> is created twice while the seventh write alignment data WAD<7> is inputted to the flip-flop FF30. The flip-flop FF30 may latch a first datum of the seventh write alignment data WAD<7> in synchronization with a first rising edge of the second internal clock signal ICLK<2> to generate a first datum bit of the eighth write alignment data WAD<8>. The flip-flop FF30 may latch a second datum of the seventh write alignment data WAD<7> in synchronization with a second rising edge of the second internal clock signal ICLK<2> to generate a second datum bit of the eighth write alignment data WAD<8>.

Figure 7:
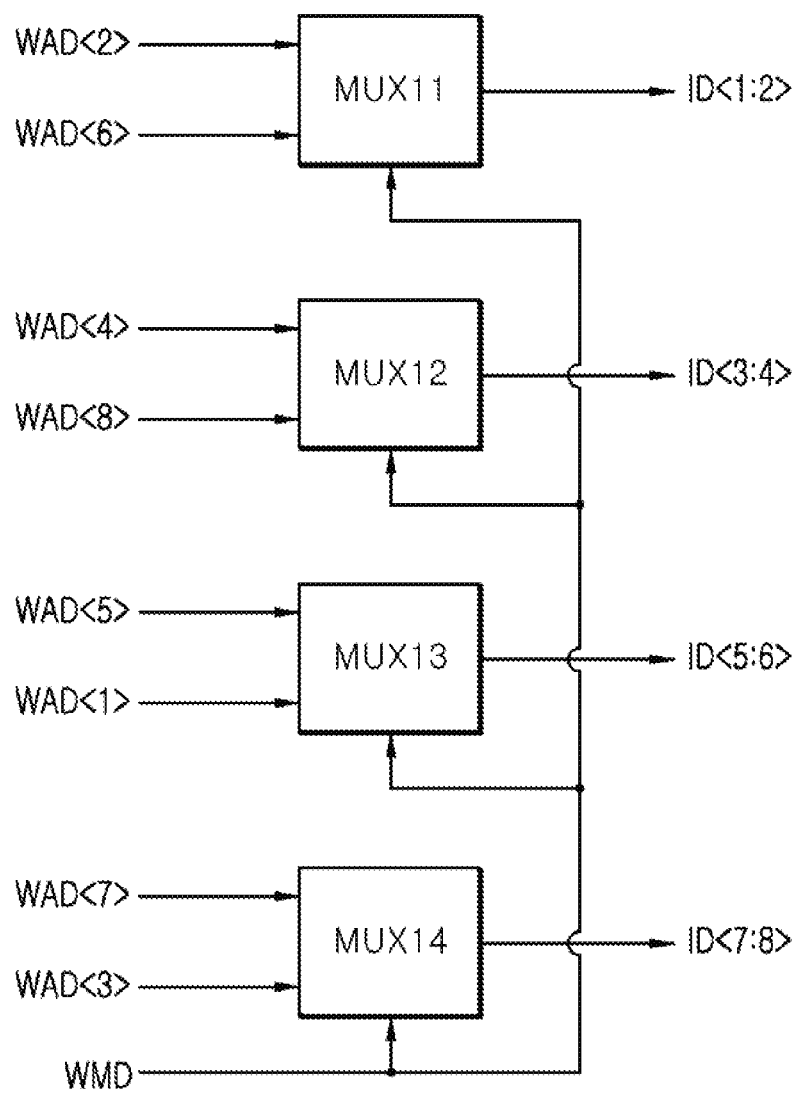
FIG. 7 is a block diagram illustrating a configuration of a write data selection circuit included in the write alignment circuit of FIG. 5.

Referring to FIG. 7, the write data selection circuit 430 may be realized using multiplexors MUX11, MUX12, MUX13, and MUX14.

The multiplexor MUX11 may output the second write alignment data WAD<2> or the sixth write alignment data WAD<6> as the first and second internal data ID<1:2> in response to the write mode signal WMD. The multiplexor MUX11 may output the second write alignment data WAD<2> as the first and second internal data ID<1:2> if the write mode signal WMD is disabled to have a logic "high" level. The multiplexor MUX11 may output the first datum bit of the second write alignment data WAD<2> as the first internal datum ID<1> if the write mode signal WMD is disabled to have a logic "high" level. The multiplexor MUX11 may output the second datum bit of the second write alignment data WAD<2> as the second internal datum ID<2> if the write mode signal WMD is disabled to have a logic "high" level. The multiplexor MUX11 may output the sixth write alignment data WAD<6> as the first and second internal data ID<1:2> if the write mode signal WMD is enabled to have a logic "low" level. The multiplexor MUX11 may output the first datum bit of the sixth write alignment data WAD<6> as the first internal datum ID<1> if the write mode signal WMD is enabled to have a logic "low" level. The multiplexor MUX11 may output the second datum bit of the sixth write alignment data WAD<6> as the second internal datum ID<2> if the write mode signal WMD is enabled to have a logic "low" level.

The multiplexor MUX12 may output the fourth write alignment data WAD<4> or the eighth write alignment data WAD<8> as the third and fourth internal data ID<3:4> in response to the write mode signal WMD. The multiplexor MUX12 may output the fourth write alignment data WAD<4> as the third and fourth internal data ID<3:4> if the write mode signal WMD is disabled to have a logic "high" level. The multiplexor MUX12 may output the first datum bit of the fourth write alignment data WAD<4> as the third internal datum ID<3> if the write mode signal WMD is disabled to have a logic "high" level. The multiplexor MUX12 may output the second datum bit of the fourth write alignment data WAD<4> as the fourth internal datum ID<4> if the write mode signal WMD is disabled to have a logic "high" level. The multiplexor MUX12 may output the eighth write alignment data WAD<8> as the third and fourth internal data ID<3:4> if the write mode signal WMD is enabled to have a logic "low" level. The multiplexor MUX12 may output the first datum bit of the eighth write alignment data WAD<8> as the third internal datum ID<3> if the write mode signal WMD is enabled to have a logic "low" level. The multiplexor MUX12 may output the second datum bit of the eighth write alignment data WAD<8> as the fourth internal datum ID<4> if the write mode signal WMD is enabled to have a logic "low" level.

The multiplexor MUX13 may output the fifth write alignment data WAD<5> or the first write alignment data WAD<1> as the fifth and sixth internal data ID<5:6> in response to the write mode signal WMD. The multiplexor MUX13 may output the fifth write alignment data WAD<5> as the fifth and sixth internal data ID<5:6> if the write mode signal WMD is disabled to have a logic "high" level. The multiplexor MUX13 may output the first datum bit of the fifth write alignment data WAD<5> as the fifth internal datum ID<5> if the write mode signal WMD is disabled to have a logic "high" level. The multiplexor MUX13 may output the second datum bit of the fifth write alignment data WAD<5> as the sixth internal datum ID<6> if the write mode signal WMD is disabled to have a logic "high" level. The multiplexor MUX13 may output the first write alignment data WAD<1> as the fifth and sixth internal data ID<5:6> if the write mode signal WMD is enabled to have a logic "low" level. The multiplexor MUX13 may output the first datum bit of the first write alignment data WAD<1> as the fifth internal datum ID<5> if the write mode signal WMD is enabled to have a logic "low" level. The multiplexor MUX13 may output the second datum bit of the first write alignment data WAD<1> as the sixth internal datum ID<6> if the write mode signal WMD is enabled to have a logic "low" level.

The multiplexor MUX14 may output the seventh write alignment data WAD<7> or the third write alignment data WAD<3> as the seventh and eighth internal data ID<7:8> in response to the write mode signal WMD. The multiplexor MUX14 may output the seventh write alignment data WAD<7> as the seventh and eighth internal data ID<7:8> if the write mode signal WMD is disabled to have a logic "high" level. The multiplexor MUX14 may output the first datum bit of the seventh write alignment data WAD<7> as the seventh internal datum ID<7> if the write mode signal WMD is disabled to have a logic "high" level. The multiplexor MUX14 may output the second datum bit of the seventh write alignment data WAD<7> as the eighth internal datum ID<8> if the write mode signal WMD is disabled to have a logic "high" level. The multiplexor MUX14 may output the third write alignment data WAD<3> as the seventh and eighth internal data ID<7:8> if the write mode signal WMD is enabled to have a logic "low" level. The multiplexor MUX14 may output the first datum bit of the third write alignment data WAD<3> as the seventh internal datum ID<7> if the write mode signal WMD is enabled to have a logic "low" level. The multiplexor MUX14 may output the second datum bit of the third write alignment data WAD<3> as the eighth internal datum ID<8> if the write mode signal WMD is enabled to have a logic "low" level.

Operations of the write control circuit 40 having the aforementioned configuration will be described hereinafter in conjunction with an example in which the write command WT is inputted to the write control circuit 40 at a time that the first internal clock signal ICLK<1> is generated and an example in which the write command WT is inputted to the write control circuit 40 at a time that the third internal clock signal ICLK<3> is generated.

First, the operation of the write control circuit 40 will be described hereinafter with reference to FIG. 8 when the write command WT is inputted to the write control circuit 40 at a time that the first internal clock signal ICLK<1> is generated.

That the write command WT is inputted to the write control circuit 40 at a time that the first internal clock signal ICLK<1> is generated may correspond to a case that the first write data WD<1> among the first to eighth write data WD<1:8> is inputted to the write control circuit 40 at a time that the first internal clock signal ICLK<1> is generated.

The write mode signal generation circuit 41 may compare an input time of the write command WT with generation times of the first to fourth internal clocks ICLK<1:4> to generate the write mode signal WMD which is disabled to have a logic "high" level.

At time "T1", the flip-flop FF21 of the internal write alignment circuit 420 may latch the first write datum WD<1> which is inputted in synchronization with a rising edge of the first internal clock signal ICLK<1>. The flip-flop FF21 may output the first write datum WD<1>, which is latched in synchronization with a rising edge of the first internal clock signal ICLK<1>, as the first latched datum LD<1>.

At time "T2", the flip-flop FF24 of the internal write alignment circuit 420 may latch the second write datum WD<2> which is inputted in synchronization with a rising edge of the second internal clock signal ICLK<2>. The flip-flop FF24 may output the second write datum WD<2>, which is latched in synchronization with a rising edge of the second internal clock signal ICLK<2>, as the third write alignment datum WAD<3>.

The flip-flop FF22 of the internal write alignment circuit 420 may latch the first latched datum LD<1> which is inputted in synchronization with a rising edge of the second internal clock signal ICLK<2>. The flip-flop FF22 may output the first latched datum LD<1>, which is latched in synchronization with a rising edge of the second internal clock signal ICLK<2>, as the first write alignment datum WAD<1>.

At time "T3", the flip-flop FF26 of the internal write alignment circuit 420 may latch the third write datum WD<3> which is inputted in synchronization with a rising edge of the third internal clock signal ICLK<3>. The flip-flop FF26 may output the third write datum WD<3>, which is latched in synchronization with a rising edge of the third internal clock signal ICLK<3>, as the second latched datum LD<2>.

At time "T4", the flip-flop FF29 of the internal write alignment circuit 420 may latch the fourth write datum WD<4> which is inputted in synchronization with a rising edge of the fourth internal clock signal ICLK<4>. The flip-flop FF29 may output the fourth write datum WD<4>, which is latched in synchronization with a rising edge of the fourth internal clock signal ICLK<4>, as the seventh write alignment datum WAD<7>.

The flip-flop FF23 of the internal write alignment circuit 420 may latch the first write alignment datum WAD<1> which is inputted in synchronization with a rising edge of the fourth internal clock signal ICLK<4>. The flip-flop FF23 may output the first write alignment datum WAD<1>, which is latched in synchronization with a rising edge of the fourth internal clock signal ICLK<4>, as the second write alignment datum WAD<2>.

The flip-flop FF25 of the internal write alignment circuit 420 may latch the third write alignment datum WAD<3> which is inputted in synchronization with a rising edge of the fourth internal clock signal ICLK<4>. The flip-flop FF25 may output the third write alignment datum WAD<3>, which is latched in synchronization with a rising edge of the fourth internal clock signal ICLK<4>, as the fourth write alignment datum WAD<4>.

The flip-flop FF27 of the internal write alignment circuit 420 may latch the second latched datum LD<2> which is inputted in synchronization with a rising edge of the fourth internal clock signal ICLK<4>. The flip-flop FF27 may output the second latched datum LD<2>, which is latched in synchronization with a rising edge of the fourth internal clock signal ICLK<4>, as the fifth write alignment datum WAD<5>.

The multiplexor MUX11 of the write data selection circuit 430 may output the second write alignment datum WAD<2> as the first internal datum ID<1> in response to the write mode signal WMD having a logic "high" level. The multiplexor MUX12 may output the fourth write alignment datum WAD<4> as the third internal datum ID<3> in response to the write mode signal WMD having a logic "high" level. The multiplexor MUX13 may output the fifth write alignment datum WAD<5> as the fifth internal datum ID<5> in response to the write mode signal WMD having a logic "high" level. The multiplexor MUX14 may output the seventh write alignment datum WAD<7> as the seventh internal datum ID<7> in response to the write mode signal WMD having a logic "high" level.

At time "T5", the flip-flop FF21 of the internal write alignment circuit 420 may latch the fifth write datum WD<5> which is inputted in synchronization with a rising edge of the first internal clock signal ICLK<1>. The flip-flop FF21 may output the fifth write datum WD<5>, which is latched in synchronization with a rising edge of the first internal clock signal ICLK<1>, as the first latched datum LD<1>.

At time "T6", the flip-flop FF24 of the internal write alignment circuit 420 may latch the sixth write datum WD<6> which is inputted in synchronization with a rising edge of the second internal clock signal ICLK<2>. The flip-flop FF24 may output the sixth write datum WD<6>, which is latched in synchronization with a rising edge of the second internal clock signal ICLK<2>, as the third write alignment datum WAD<3>.

The flip-flop FF22 of the internal write alignment circuit 420 may latch the first latched datum LD<1> which is inputted in synchronization with a rising edge of the second internal clock signal ICLK<2>. The flip-flop FF22 may output the first latched datum LD<1>, which is latched in synchronization with a rising edge of the second internal clock signal ICLK<2>, as the first write alignment datum WAD<1>.

At time "T7", the flip-flop FF26 of the internal write alignment circuit 420 may latch the seventh write datum WD<7> which is inputted in synchronization with a rising edge of the third internal clock signal ICLK<3>. The flip-flop FF26 may output the seventh write datum WD<7>, which is latched in synchronization with a rising edge of the third internal clock signal ICLK<3>, as the second latched datum LD<2>.

At time "T8", the flip-flop FF29 of the internal write alignment circuit 420 may latch the eighth write datum WD<8> which is inputted in synchronization with a rising edge of the fourth internal clock signal ICLK<4>. The flip-flop FF29 may output the eighth write datum WD<8>, which is latched in synchronization with a rising edge of the fourth internal clock signal ICLK<4>, as the seventh write alignment datum WAD<7>.

The flip-flop FF23 of the internal write alignment circuit 420 may latch the first write alignment datum WAD<1> which is inputted in synchronization with a rising edge of the fourth internal clock signal ICLK<4>. The flip-flop FF23 may output the first write alignment datum WAD<1>, which is latched in synchronization with a rising edge of the fourth internal clock signal ICLK<4>, as the second write alignment datum WAD<2>.

The flip-flop FF25 of the internal write alignment circuit 420 may latch the third write alignment datum WAD<3> which is inputted in synchronization with a rising edge of the fourth internal clock signal ICLK<4>. The flip-flop FF25 may output the third write alignment datum WAD<3>, which is latched in synchronization with a rising edge of the fourth internal clock signal ICLK<4>, as the fourth write alignment datum WAD<4>.

The flip-flop FF27 of the internal write alignment circuit 420 may latch the second latched datum LD<2> which is inputted in synchronization with a rising edge of the fourth internal clock signal ICLK<4>. The flip-flop FF27 may output the second latched datum LD<2>, which is latched in synchronization with a rising edge of the fourth internal clock signal ICLK<4>, as the fifth write alignment datum WAD<5>.

The multiplexor MUX11 of the write data selection circuit 430 may output the second write alignment datum WAD<2> as the second internal datum ID<2> in response to the write mode signal WMD having a logic "high" level. The multiplexor MUX12 may output the fourth write alignment datum WAD<4> as the fourth internal datum ID<4> in response to the write mode signal WMD having a logic "high" level. The multiplexor MUX13 may output the fifth write alignment datum WAD<5> as the sixth internal datum ID<6> in response to the write mode signal WMD having a logic "high" level. The multiplexor MUX14 may output the seventh write alignment datum WAD<7> as the eighth internal datum ID<8> in response to the write mode signal WMD having a logic "high" level.

Figure 8:
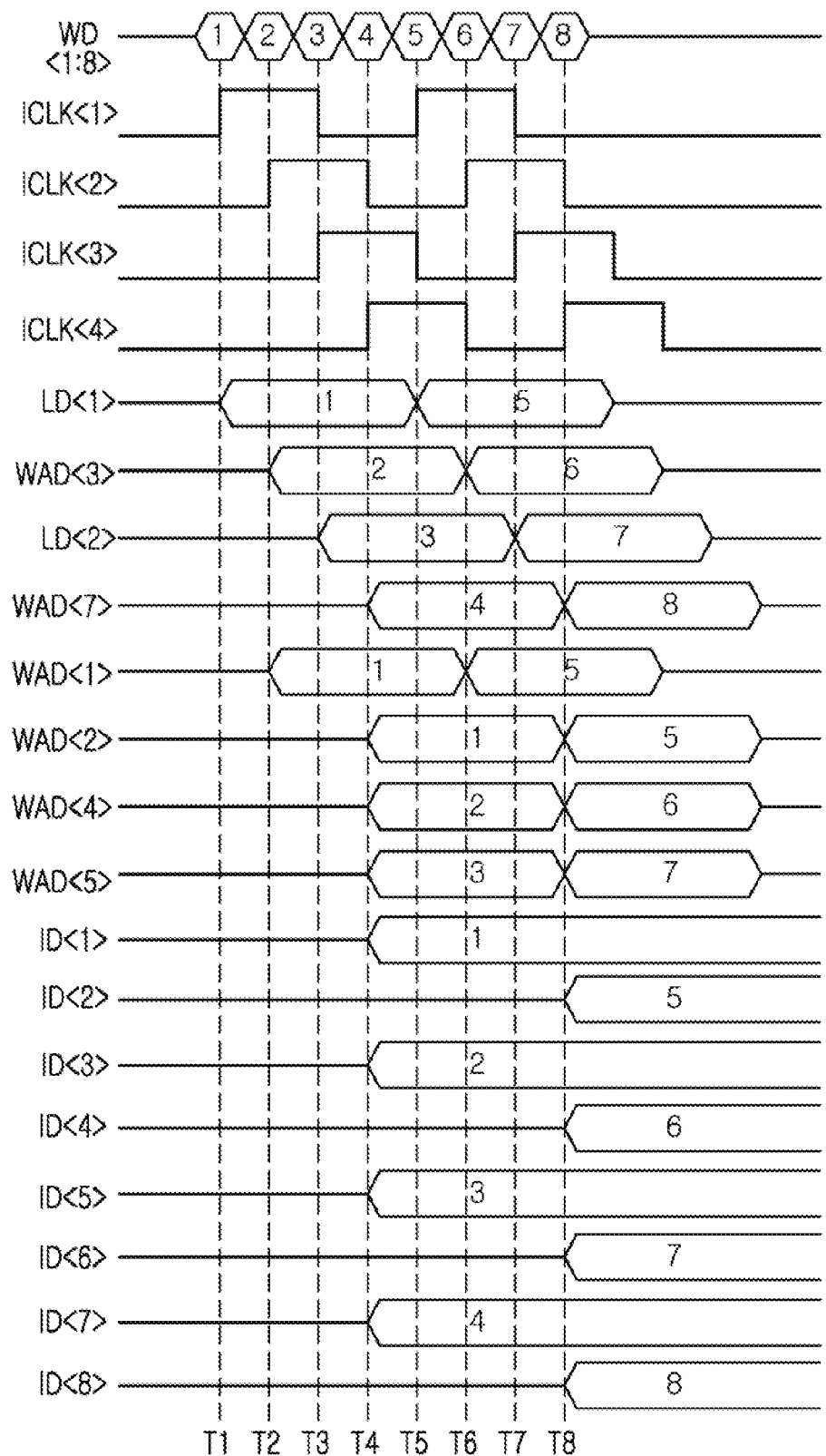
FIGS. 8 and 9 are timing diagrams illustrating operations of a write control circuit included in the semiconductor device of FIG. 1.

In FIG. 8, the natural numbers of "1" to "8" described in waveforms of the first and second latched data LD<1:2>, the first to fifth write alignment data WAD<1:5>, the seventh write alignment data WAD<7>, and the first to eighth internal data ID<1:8> mean the bit numbers of the first to eighth write data WD<1:8> from which the first and second latched data LD<1:2>, the first to fifth write alignment data WAD<1:5>, the seventh write alignment data WAD<7>, and the first to eighth internal data ID<1:8> are generated. For example, the first latched datum LD<1> denoted by the natural number of "5" means a datum which is generated from the fifth datum bit (i.e., the fifth write datum WD<5>) among the first to eighth write data WD<1:8>.

Next, the operation of the write control circuit 40 will be described hereinafter with reference to FIG. 9 in case that the write command WT is inputted to the write control circuit 40 at a time that the third internal clock signal ICLK<3> is generated.

That the write command WT is inputted to the write control circuit 40 at a time that the third internal clock signal ICLK<3> is generated may correspond to a case that the first write data WD<1> among the first to eighth write data WD<1:8> is inputted to the write control circuit 40 at a time that the third internal clock signal ICLK<3> is generated.

The write mode signal generation circuit 41 may compare an input time of the write command WT with generation times of the first to fourth internal clocks ICLK<1:4> to generate the write mode signal WMD which is enabled to have a logic "low" level.

At time "T11", the flip-flop FF26 of the internal write alignment circuit 420 may latch the first write datum WD<1> which is inputted in synchronization with a rising edge of the third internal clock signal ICLK<3>. The flip-flop FF26 may output the first write datum WD<1>, which is latched in synchronization with a rising edge of the third internal clock signal ICLK<3>, as the second latched datum LD<2>.

At time "T12", the flip-flop FF29 of the internal write alignment circuit 420 may latch the second write datum WD<2> which is inputted in synchronization with a rising edge of the fourth internal clock signal ICLK<4>. The flip-flop FF29 may output the second write datum WD<2>, which is latched in synchronization with a rising edge of the fourth internal clock signal ICLK<4>, as the seventh write alignment datum WAD<7>.

The flip-flop FF27 of the internal write alignment circuit 420 may latch the second latched datum LD<2> which is inputted in synchronization with a rising edge of the fourth internal clock signal ICLK<4>. The flip-flop FF27 may output the second latched datum LD<2>, which is latched in synchronization with a rising edge of the fourth internal clock signal ICLK<4>, as the fifth write alignment datum WAD<5>.

At time "T13", the flip-flop FF21 of the internal write alignment circuit 420 may latch the third write datum WD<3> which is inputted in synchronization with a rising edge of the first internal clock signal ICLK<1>. The flip-flop FF21 may output the third write datum WD<3>, which is latched in synchronization with a rising edge of the first internal clock signal ICLK<1>, as the first latched datum LD<1>.

At time "T14", the flip-flop FF24 of the internal write alignment circuit 420 may latch the fourth write datum WD<4> which is inputted in synchronization with a rising edge of the second internal clock signal ICLK<2>. The flip-flop FF24 may output the fourth write datum WD<4>, which is latched in synchronization with a rising edge of the second internal clock signal ICLK<2>, as the third write alignment datum WAD<3>.

The flip-flop FF22 of the internal write alignment circuit 420 may latch the first latched datum LD<1> which is inputted in synchronization with a rising edge of the second internal clock signal ICLK<2>. The flip-flop FF22 may output the first latched datum LD<1>, which is latched in synchronization with a rising edge of the second internal clock signal ICLK<2>, as the first write alignment datum WAD<1>.

The flip-flop FF28 of the internal write alignment circuit 420 may latch the fifth write alignment datum WAD<5> which is inputted in synchronization with a rising edge of the second internal clock signal ICLK<2>. The flip-flop FF28 may output the fifth write alignment datum WAD<5>, which is latched in synchronization with a rising edge of the second internal clock signal ICLK<2>, as the sixth write alignment datum WAD<6>.

The flip-flop FF30 of the internal write alignment circuit 420 may latch the seventh write alignment datum WAD<7> which is inputted in synchronization with a rising edge of the second internal clock signal ICLK<2>. The flip-flop FF30 may output the seventh write alignment datum WAD<7>, which is latched in synchronization with a rising edge of the second internal clock signal ICLK<2>, as the eighth write alignment datum WAD<8>.

The multiplexor MUX11 of the write data selection circuit 430 may output the sixth write alignment datum WAD<6> as the first internal datum ID<1> in response to the write mode signal WMD having a logic "low" level. The multiplexor MUX12 may output the eighth write alignment datum WAD<8> as the third internal datum ID<3> in response to the write mode signal WMD having a logic "low" level. The multiplexor MUX13 may output the first write alignment datum WAD<1> as the fifth internal datum ID<5> in response to the write mode signal WMD having a logic "low" level. The multiplexor MUX14 may output the third write alignment datum WAD<3> as the seventh internal datum ID<7> in response to the write mode signal WMD having a logic "low" level.

At time "T15", the flip-flop FF26 of the internal write alignment circuit 420 may latch the fifth write datum WD<5> which is inputted in synchronization with a rising edge of the third internal clock signal ICLK<3>. The flip-flop FF26 may output the fifth write datum WD<5>, which is latched in synchronization with a rising edge of the third internal clock signal ICLK<3>, as the second latched datum LD<2>.

At time "T16", the flip-flop FF29 of the internal write alignment circuit 420 may latch the sixth write datum WD<6> which is inputted in synchronization with a rising edge of the fourth internal clock signal ICLK<4>. The flip-flop FF29 may output the sixth write datum WD<6>, which is latched in synchronization with a rising edge of the fourth internal clock signal ICLK<4>, as the seventh write alignment datum WAD<7>.

The flip-flop FF27 of the internal write alignment circuit 420 may latch the second latched datum LD<2> which is inputted in synchronization with a rising edge of the fourth internal clock signal ICLK<4>. The flip-flop FF27 may output the second latched datum LD<2>, which is latched in synchronization with a rising edge of the fourth internal clock signal ICLK<4>, as the fifth write alignment datum WAD<5>.

At time "T17", the flip-flop FF21 of the internal write alignment circuit 420 may latch the seventh write datum WD<7> which is inputted in synchronization with a rising edge of the first internal clock signal ICLK<1>. The flip-flop FF21 may output the seventh write datum WD<7>, which is latched in synchronization with a rising edge of the first internal clock signal ICLK<1>, as the first latched datum LD<1>.

At time "T18", the flip-flop FF24 of the internal write alignment circuit 420 may latch the eighth write datum WD<8> which is inputted in synchronization with a rising edge of the second internal clock signal ICLK<2>. The flip-flop FF24 may output the eighth write datum WD<8>, which is latched in synchronization with a rising edge of the second internal clock signal ICLK<2>, as the third write alignment datum WAD<3>.

The flip-flop FF22 of the internal write alignment circuit 420 may latch the first latched datum LD<1> which is inputted in synchronization with a rising edge of the second internal clock signal ICLK<2>. The flip-flop FF22 may output the first latched datum LD<1>, which is latched in synchronization with a rising edge of the second internal clock signal ICLK<2>, as the first write alignment datum WAD<1>.

The flip-flop FF28 of the internal write alignment circuit 420 may latch the fifth write alignment datum WAD<5> which is inputted in synchronization with a rising edge of the second internal clock signal ICLK<2>. The flip-flop FF28 may output the fifth write alignment datum WAD<5>, which is latched in synchronization with a rising edge of the second internal clock signal ICLK<2>, as the sixth write alignment datum WAD<6>.

The flip-flop FF30 of the internal write alignment circuit 420 may latch the seventh write alignment datum WAD<7> which is inputted in synchronization with a rising edge of the second internal clock signal ICLK<2>. The flip-flop FF30 may output the seventh write alignment datum WAD<7>, which is latched in synchronization with a rising edge of the second internal clock signal ICLK<2>, as the eighth write alignment datum WAD<8>.

The multiplexor MUX11 of the write data selection circuit 430 may output the sixth write alignment datum WAD<6> as the second internal datum ID<2> in response to the write mode signal WMD having a logic "low" level. The multiplexor MUX12 may output the eighth write alignment datum WAD<8> as the fourth internal datum ID<4> in response to the write mode signal WMD having a logic "low" level. The multiplexor MUX13 may output the first write alignment datum WAD<1> as the sixth internal datum ID<6> in response to the write mode signal WMD having a logic "low" level. The multiplexor MUX14 may output the third write alignment datum WAD<3> as the eighth internal datum ID<8> in response to the write mode signal WMD having a logic "low" level.

Figure 9:
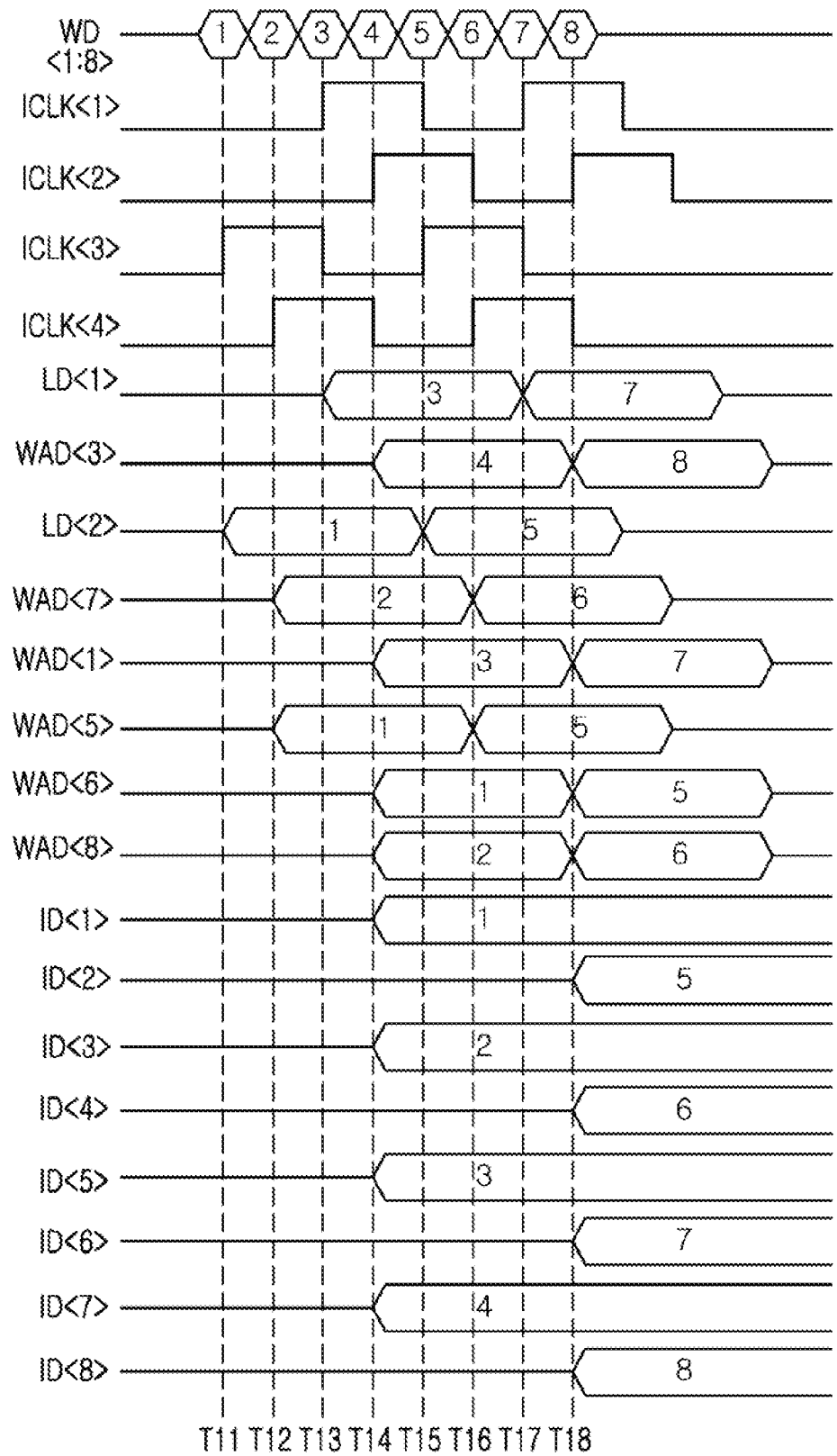

In FIG. 9, the natural numbers of "1" to "8" described in waveforms of the first and second latched data LD<1:2>, the first write alignment datum WAD<1>, the third write alignment datum WAD<3>, the fifth to eighth write alignment data WAD<5:8>, and the first to eighth internal data ID<1:8> mean the bit numbers of the first to eighth write data WD<1:8> from which the first and second latched data LD<1:2>, the first write alignment datum WAD<1>, the third write alignment datum WAD<3>, the fifth to eighth write alignment data WAD<5:8>, and the first to eighth internal data ID<1:8> are generated. For example, the second latched datum LD<2> denoted by the natural number of "1" means a datum which is generated from the first datum bit (i.e., the first write datum WD<1>) among the first to eighth write data WD<1:8>.

Figure 10:
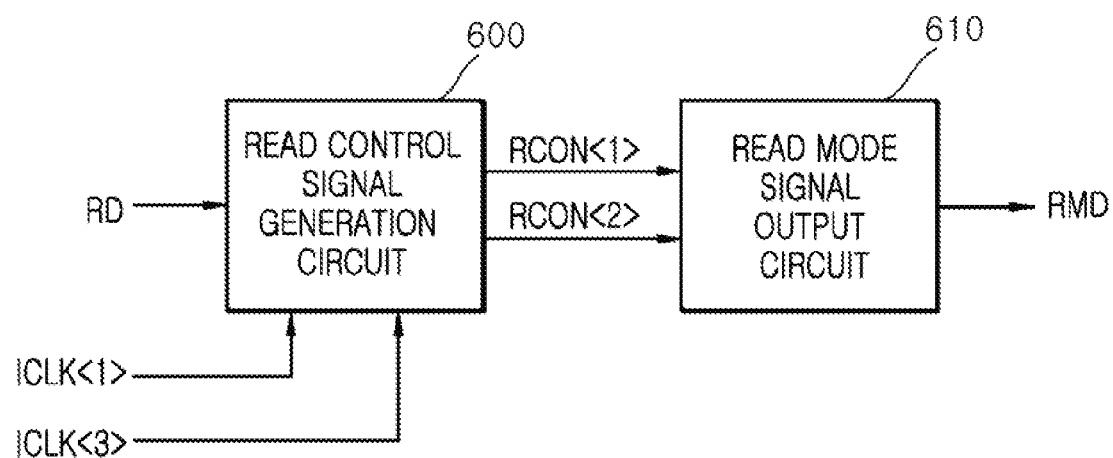
FIG. 10 is a block diagram illustrating a configuration of a read mode signal generation circuit included in the semiconductor device of FIG. 1.

Referring to FIG. 10, the read mode signal generation circuit 61 may include a read control signal generation circuit 600 and a read mode signal output circuit 610.

The read control signal generation circuit 600 may compare the input time of the read command RD with the generation times of the first internal clock signal ICLK<1> and the third internal clock signal ICLK<3> to generate a first read control signal RCON<1> and a second read control signal RCON<2>. The read control signal generation circuit 600 may compare the input time of the read command RD with the generation time of the first internal clock signal ICLK<1> to generate the first read control signal RCON<1>. The read control signal generation circuit 600 may generate the first read control signal RCON<1> which is enabled if the read command RD is inputted to the read control signal generation circuit 600 at a time that the first internal clock signal ICLK<1> is generated. The read control signal generation circuit 600 may compare the input time of the read command RD with the generation time of the third internal clock signal ICLK<3> to generate the second read control signal RCON<2>. The read control signal generation circuit 600 may generate the second read control signal RCON<2> which is enabled if the read command RD is inputted to the read control signal generation circuit 600 at a time that the third internal clock signal ICLK<3> is generated. Logic levels of the first and second read control signals RCON<1:2>, which are enabled, may be set to be different according to the embodiment.

The read mode signal output circuit 610 may generate the read mode signal RMD in response to the first and second read control signals RCON<1:2>. The read mode signal output circuit 610 may generate the read mode signal RMD which is enabled if the second read control signal RCON<2> is enabled. The read mode signal output circuit 610 may generate the read mode signal RMD which is disabled if the first read control signal RCON<1> is enabled.

Figure 11:
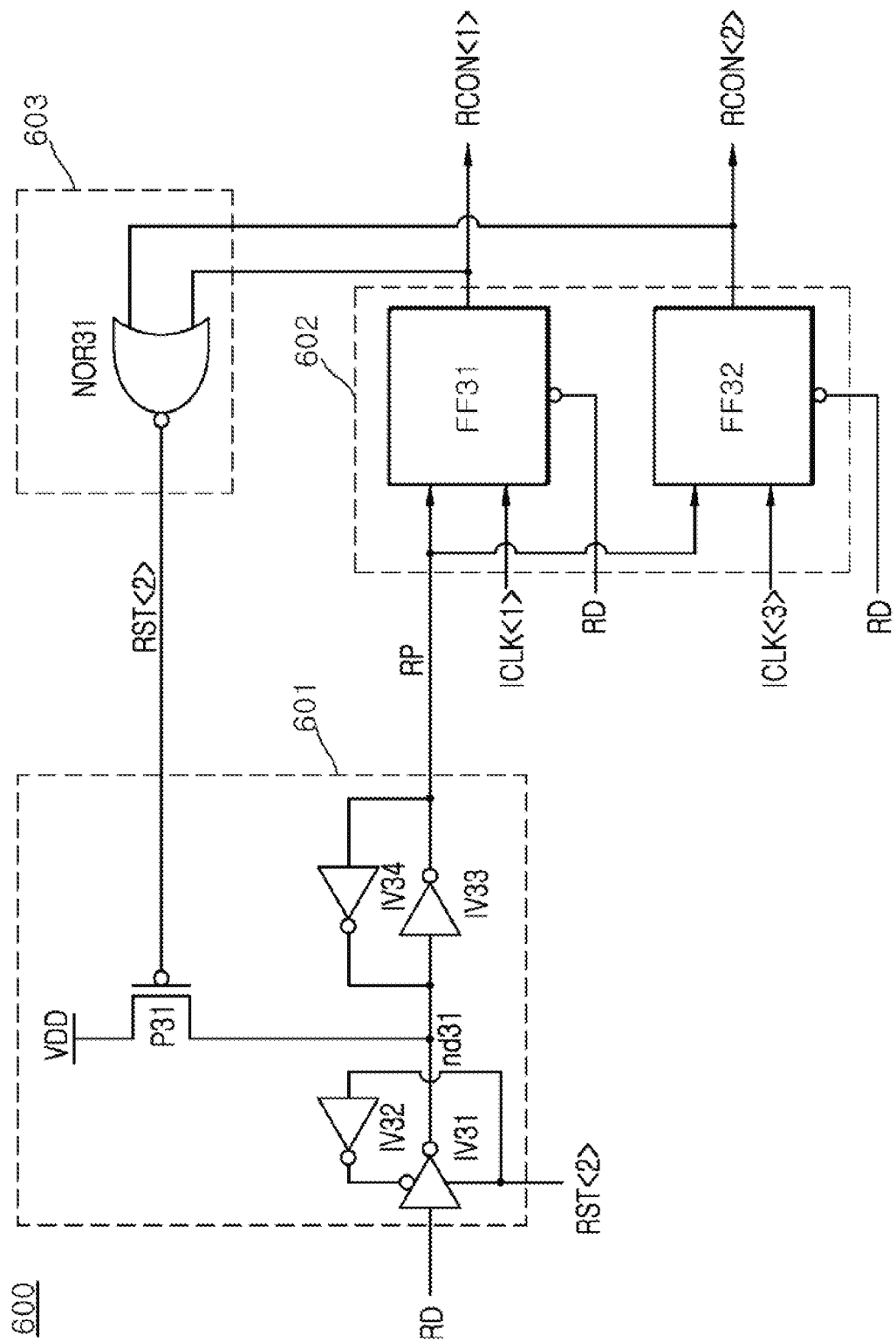
FIG. 11 is a circuit diagram illustrating a configuration of a read control signal generation circuit included in the read mode signal generation circuit of FIG. 10.

Referring to FIG. 11, the read control signal generation circuit 600 may include a read pulse generation circuit 601, a second phase comparison circuit 602, and a second reset signal generation circuit 603.

The read pulse generation circuit 601 may be configured to include inverters IV31, IV32, IV33, and IV34 and a PMOS transistor P31. The PMOS transistor P31 may be coupled between the power supply voltage VDD terminal and a node nd31, and a second reset signal RST<2> may be applied to a gate of the PMOS transistor P31. The read pulse generation circuit 601 may generate a read pulse RP which is initialized in response to the second reset signal RST<2>. If the second reset signal RST<2> is enabled to have a logic "low" level, the PMOS transistor P31 may be turned on to drive the node nd31 to a level of the power supply voltage VDD, and a latch circuit comprised of the inverters IV33 and IV34 may inversely buffer a signal of the node nd31 to generate the read pulse RP which is initialized to have a logic "low" level. The inverter IV31 may inversely buffer the read command RD to output the inversely buffered read command to the node nd31. The inverter IV31 may be realized using a three-phase inverter or a transfer gate which is turned on or off according to the second reset signal RST<2>. The write pulse generation circuit 601 may generate the read pulse RP which is created during a predetermined period in response to the second reset signal RST<2> at a time that the read command RD is inputted to the inverter IV31. The read pulse generation circuit 601 may generate the read pulse RP which is created during a predetermined period at a time that the read command RD is inputted to the inverter IV31, if the second reset signal RST<2> is disabled to have a logic "high" level.

The second phase comparison circuit 602 may be realized using flip-flops FF31 and FF32. The flip-flop FF31 may generate the first read control signal RCON<1> which is initialized if the read command RD is not inputted thereto. That is, the flip-flop FF31 may generate the first read control signal RCON<1> which is initialized to have a logic "low" level if the read command RD having a logic "low" level is inputted to the flip-flop FF31. The flip-flop FF31 may latch the read pulse RP to generate the first read control signal RCON<1> during a period that the first internal clock signal ICLK<1> is generated. The flip-flop FF31 may generate the first read control signal RCON<1> which is enabled to have a logic "high" level if the read pulse RP having a logic "high" level is inputted to the flip-flop FF31 during a period that the first internal clock signal ICLK<1> is generated. The flip-flop FF32 may generate the second read control signal RCON<2> which is initialized if the read command RD is not inputted thereto. That is, the flip-flop FF32 may generate the second read control signal RCON<2> which is initialized to have a logic "low" level if the read command RD having a logic "low" level is inputted to the flip-flop FF32. The flip-flop FF32 may latch the read pulse RP to generate the second read control signal RCON<2> during a period that the third internal clock signal ICLK<3> is generated. The flip-flop FF32 may generate the second read control signal RCON<2> which is enabled to have a logic "high" level if the read pulse RP having a logic "high" level is inputted to the flip-flop FF32 during a period that the third internal clock signal ICLK<3> is generated.

The second reset signal generation circuit 603 may be realized using a NOR gate NOR31. The second reset signal generation circuit 603 may perform a NOR operation of the first read control signal RCON<1> and the second read control signal RCON<2> to generate the second reset signal RST<2>. The second reset signal generation circuit 603 may generate the second reset signal RST<2> which is enabled to have a logic "low" level if at least one of the first and second read control signals RCON<1:2> has a logic "high" level. The second reset signal generation circuit 603 may generate the second reset signal RST<2> which is disabled to have a logic "high" level if both of the first and second read control signals RCON<1:2> has a logic "low" level.

Figure 12:
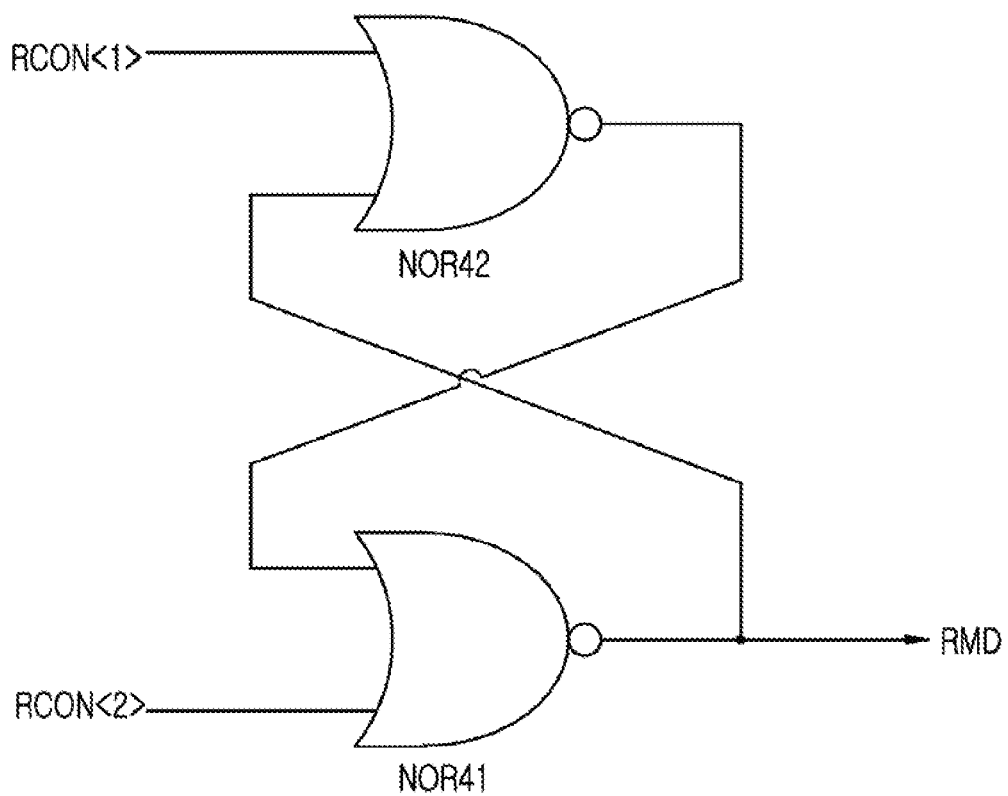
FIG. 12 is a circuit diagram illustrating a configuration of a read mode signal output circuit included in the read mode signal generation circuit of FIG. 10.

Referring to FIG. 12, the read mode signal output circuit 610 may be realized using an SR-latch circuit which is comprised of NOR gates NOR41 and NOR42.

The read mode signal output circuit 610 may generate the read mode signal RMD which is enabled in response to the second read control signal RCON<2>. The read mode signal output circuit 610 may generate the read mode signal RMD which is enabled to have a logic "low" level if the second read control signal RCON<2> is has a logic "high" level. The read mode signal output circuit 610 may generate the read mode signal RMD which is disabled in response to the first read control signal RCON<1>. The read mode signal output circuit 610 may generate the read mode signal RMD which is disabled to have a logic "high" level if the first read control signal RCON<1> has a logic "high" level.

Figure 13:
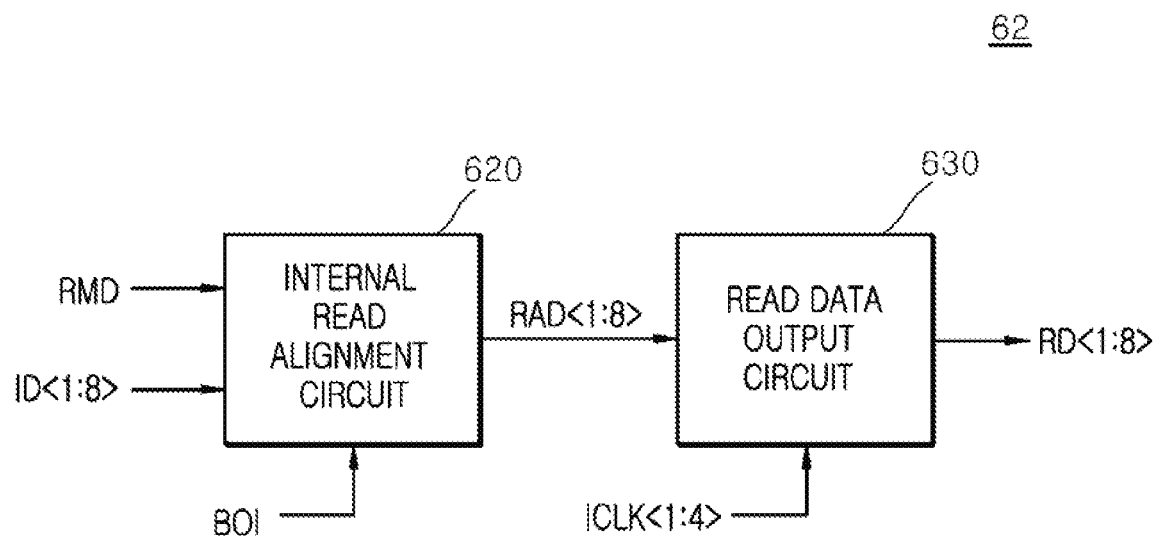
FIG. 13 is a block diagram illustrating a configuration of a read alignment circuit included in the semiconductor device of FIG. 1.

Referring to FIG. 13, the read alignment circuit 62 may include an internal read alignment circuit 620 and a read data output circuit 630.

The internal read alignment circuit 620 may align the first to eighth internal data ID<1:8> in a predetermined sequence according to a burst order information signal BOI to generate first to eighth read alignment data RAD<1:8>, in response to the read mode signal RMD. The internal read alignment circuit 620 may generate the first to eighth read alignment data RAD<1:8> without aligning the first to eighth internal data ID<1:8> according to the burst order information signal BOI, in response to the read mode signal RMD. Although FIG. 13 illustrates an example in which the internal read alignment circuit 620 generates the first to eighth read alignment data RAD<1:8>, the present disclosure is not limited thereto. For example, the amount of read alignment data generated by the internal read alignment circuit 620 may be set to be less than or greater than eight according to the embodiment. A configuration and an operation of the internal read alignment circuit 620 generating the first to eighth read alignment data RAD<1:8> will be described more fully with reference to FIGS. 14, 16 and 17 later. The burst order information signal BOI may be a signal for setting an alignment sequence of data according to a configuration of the semiconductor device.

The read data output circuit 630 may be synchronized with the first to fourth internal clock signals ICLK<1:4> to drive the first to eighth read data RD<1:8> in response to the first to eighth read alignment data RAD<1:8>. Although FIG. 13 illustrates an example in which the read data output circuit 630 generates the first to eighth read data RD<1:8>, the present disclosure is not limited thereto. For example, the amount of read data generated by the read data output circuit 630 may be set to be less than or greater than eight according to the embodiments. A configuration and an operation of the write data selection circuit 430 generating the first to eighth read data RD<1:8> will be described more fully with reference to FIGS. 15, 16 and 17 later.

Figure 14:
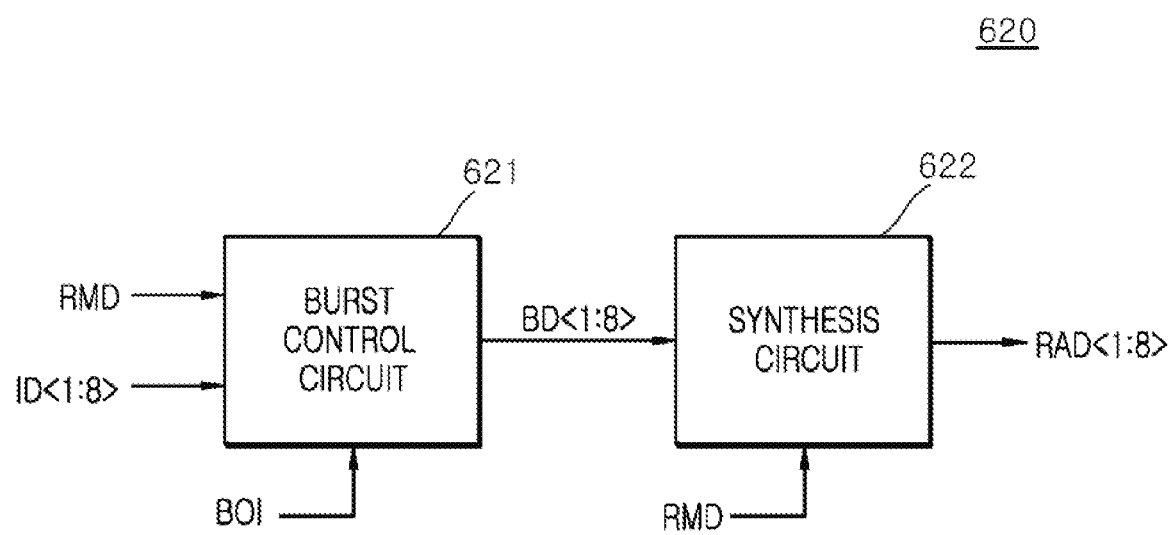
FIG. 14 is a block diagram illustrating a configuration of an internal read alignment circuit included in the read alignment circuit of FIG. 13.

Referring to FIG. 14, the internal read alignment circuit 620 may include a burst control circuit 621 and a synthesis circuit 622.

The burst control circuit 621 may align the first to eighth internal data ID<1:8> in a predetermined sequence according to the burst order information signal BOI to generate first to eighth burst data BD<1:8>, in response to the read mode signal RMD. The burst control circuit 621 may generate the first to eighth burst data BD<1:8> without aligning the first to eighth internal data ID<1:8> according to the burst order information signal BOI, in response to the read mode signal RMD. Although FIG. 14 illustrates an example in which the burst control circuit 621 generates the first to eighth burst data BD<1:8>, the present disclosure is not limited thereto. For example, the amount of burst data generated by the burst control circuit 621 may be set to be less than or greater than eight according to the embodiments.

The synthesis circuit 622 may synthesize the first to eighth burst data BD<1:8> in response to the read mode signal RMD to generate the first to eighth read alignment data RAD<1:8>. Although FIG. 14 illustrates an example in which the synthesis circuit 622 generates the first to eighth read alignment data RAD<1:8>, the present disclosure is not limited thereto. For example, the amount of read alignment data generated by the synthesis circuit 622 may be set to be less than or greater than eight according to the embodiments.

Figure 15:
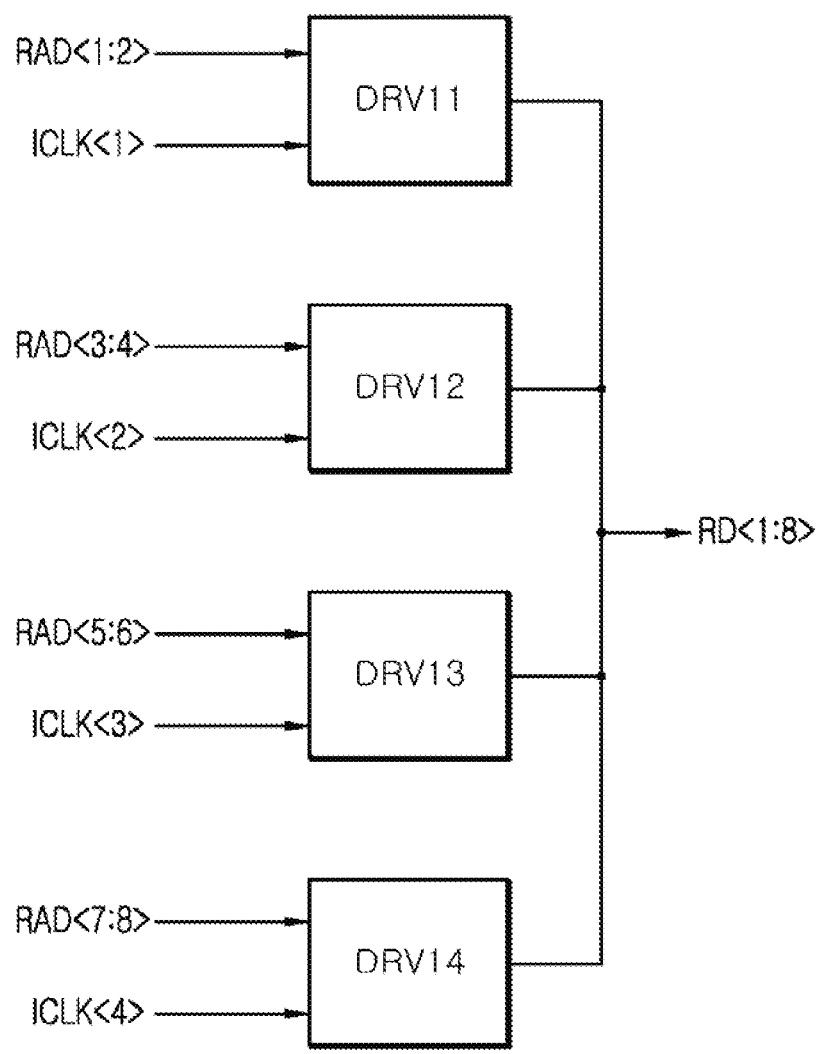
FIG. 15 is a block diagram illustrating a configuration of a read data output circuit included in the read alignment circuit of FIG. 13.

Referring to FIG. 15, the read data output circuit 630 may include drivers DRV11, DRV12, DRV13, and DRV14.

The driver DRV11 may be synchronized with a rising edge of the first internal clock signal ICLK<1> to drive any one of the first to eighth read data RD<1:8>, in response to the first read alignment datum RAD<1>. The driver DRV11 may be synchronized with a rising edge of the first internal clock signal ICLK<1> to drive any one of the first to eighth read data RD<1:8>, in response to the second read alignment datum RAD<2>.

The driver DRV12 may be synchronized with a rising edge of the second internal clock signal ICLK<2> to drive any one of the first to eighth read data RD<1:8>, in response to the third read alignment datum RAD<3>. The driver DRV12 may be synchronized with a rising edge of the second internal clock signal ICLK<2> to drive any one of the first to eighth read data RD<1:8>, in response to the fourth read alignment datum RAD<4>.

The driver DRV13 may be synchronized with a rising edge of the third internal clock signal ICLK<3> to drive any one of the first to eighth read data RD<1:8>, in response to the fifth read alignment datum RAD<5>. The driver DRV13 may be synchronized with a rising edge of the third internal clock signal ICLK<3> to drive any one of the first to eighth read data RD<1:8>, in response to the sixth read alignment datum RAD<6>.

The driver DRV14 may be synchronized with a rising edge of the fourth internal clock signal ICLK<4> to drive any one of the first to eighth read data RD<1:8>, in response to the seventh read alignment datum RAD<7>. The driver DRV14 may be synchronized with a rising edge of the fourth internal clock signal ICLK<4> to drive any one of the first to eighth read data RD<1:8>, in response to the eighth read alignment datum RAD<8>.

Operations of the read control circuit 60 having the aforementioned configuration will be described hereinafter in conjunction with an example in which the read command RD is inputted to the read control circuit 60 at a time that the first internal clock signal ICLK<1> is generated and an example in which the read command RD is inputted to the read control circuit 60 at a time that the third internal clock signal ICLK<3> is generated.

First, an operation for generating the first to eighth read alignment data RAD<1:8> from the first to eighth internal data ID<1:8> will be described hereinafter with reference to FIGS. 10, 14 and 16 in case that the read command RD is inputted to the read control circuit 60 at a time that the first internal clock signal ICLK<1> is generated.

The read mode signal generation circuit 61 may compare an input time of the read command RD with generation times of the first to fourth internal clocks ICLK<1:4> to generate the read mode signal RMD which is disabled to have a logic "high" level.

The burst control circuit 621 of the internal read alignment circuit 620 may generate the first to eighth burst data BD<1:8> without aligning the first to eighth internal data ID<1:8> according to the burst order information signal BOI, in response to the read mode signal RMD having a logic "high" level. For example, as illustrated in FIG. 16, if an alignment sequence of the first to eighth internal data ID<1:8> is not changed, the first internal datum ID<1> may be outputted as the first burst datum BD<1>, the second internal datum ID<2> may be outputted as the second burst datum BD<2>, the third internal datum ID<3> may be outputted as the third burst datum BD<3>, the fourth internal datum ID<4> may be outputted as the fourth burst datum BD<4>, the fifth internal datum ID<5> may be outputted as the fifth burst datum BD<5>, the sixth internal datum ID<6> may be outputted as the sixth burst datum BD<6>, the seventh internal datum ID<7> may be outputted as the seventh burst datum BD<7>, and the eighth internal datum ID<8> may be outputted as the eighth burst datum BD<8>.

The synthesis circuit 622 may output the second burst datum BD<2> as the third read alignment datum RAD<3> after outputting the first burst datum BD<1> as the first read alignment datum RAD<1>, in response to the read mode signal RMD having a logic "high" level. The synthesis circuit 622 may output the fourth burst datum BD<4> as the seventh read alignment datum RAD<7> after outputting the third burst datum BD<3> as the fifth read alignment datum RAD<5>, in response to the read mode signal RMD having a logic "high" level. The synthesis circuit 622 may output the sixth burst datum BD<6> as the fourth read alignment datum RAD<4> after outputting the fifth burst datum BD<5> as the second read alignment datum RAD<2>, in response to the read mode signal RMD having a logic "high" level. The synthesis circuit 622 may output the eighth burst datum BD<8> as the eighth read alignment datum RAD<8> after outputting the seventh burst datum BD<7> as the sixth read alignment datum RAD<6>, in response to the read mode signal RMD having a logic "high" level. In such a case, the first read alignment datum RAD<1> and the second read alignment datum RAD<2> may be sequentially outputted in series, the third read alignment datum RAD<3> and the fourth read alignment datum RAD<4> may be sequentially outputted in series, the fifth read alignment datum RAD<5> and the sixth read alignment datum RAD<6> may be sequentially outputted in series, and the seventh read alignment datum RAD<7> and the eighth read alignment datum RAD<8> may be sequentially outputted in series.

Referring again to FIG. 16, an operation for generating the first to eighth read data RD<1:8> from the first to eighth read alignment data RAD<1:8> will be described hereinafter in case that the read command RD is inputted to the read control circuit 60 at a time that the first internal clock signal ICLK<1> is generated.

At time "T21", the driver DRV11 may be synchronized with a rising edge of the first internal clock signal ICLK<1> to drive the first read datum RD<1>, in response to the first read alignment datum RAD<1>.

At time "T22", the driver DRV12 may be synchronized with a rising edge of the second internal clock signal ICLK<2> to drive the second read datum RD<2>, in response to the third read alignment datum RAD<3>.

At time "T23", the driver DRV13 may be synchronized with a rising edge of the third internal clock signal ICLK<3> to drive the third read datum RD<3>, in response to the fifth read alignment datum RAD<5>.

At time "T24", the driver DRV14 may be synchronized with a rising edge of the fourth internal clock signal ICLK<4> to drive the fourth read datum RD<4>, in response to the seventh read alignment datum RAD<7>.

At time "T25", the driver DRV11 may be synchronized with a rising edge of the first internal clock signal ICLK<1> to drive the fifth read datum RD<5>, in response to the second read alignment datum RAD<2>.

At time "T26", the driver DRV12 may be synchronized with a rising edge of the second internal clock signal ICLK<2> to drive the sixth read datum RD<6>, in response to the fourth read alignment datum RAD<4>.

At time "T27", the driver DRV13 may be synchronized with a rising edge of the third internal clock signal ICLK<3> to drive the seventh read datum RD<7>, in response to the sixth read alignment datum RAD<6>.

At time "T28", the driver DRV14 may be synchronized with a rising edge of the fourth internal clock signal ICLK<4> to drive the eighth read datum RD<8>, in response to the eighth read alignment datum RAD<8>.

Figure 16:
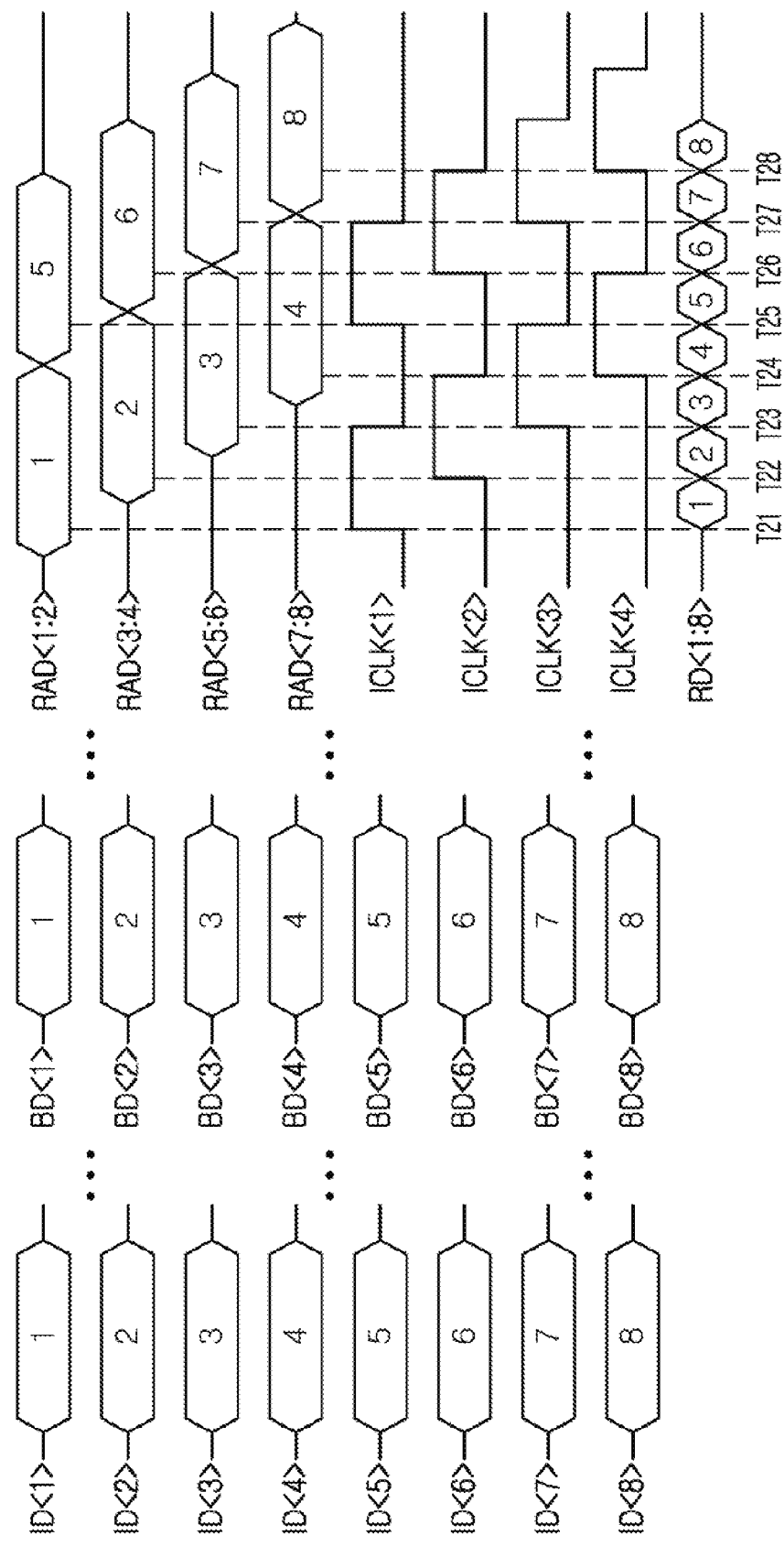
FIGS. 16 and 17 are timing diagrams illustrating operations of a read control circuit included in the semiconductor device of FIG. 1.

In FIG. 16, the natural numbers of "1" to "8" described in waveforms of the first to eighth burst data BD<1:8>, the first to eighth read alignment data RAD<1:8> and the first to eighth read data RD<1:8> mean the bit numbers of the first to eighth internal data ID<1:8> from which the first to eighth burst data BD<1:8>, the first to eighth read alignment data RAD<1:8>, and the first to eighth read data RD<1:8> are generated. For example, the first burst datum BD<1> denoted by the natural number of "1" means a datum which is generated from the first datum bit (i.e., the first internal datum ID<1>) among the first to eighth internal data ID<1: 8>.

Next, an operation for generating the first to eighth read alignment data RAD<1:8> from the first to eighth internal data ID<1:8> will be described hereinafter with reference to FIGS. 10, 14 and 17 in case that the read command RD is inputted to the read control circuit 60 at a point of time that the third internal clock signal ICLK<3> is generated.

The read mode signal generation circuit 61 may compare an input point of time of the read command RD with generation times of the first to fourth internal clocks ICLK<1:4> to generate the read mode signal RMD which is disabled to have a logic "low" level.

The burst control circuit 621 of the internal read alignment circuit 620 may align the first to eighth internal data ID<1:8> in a predetermined sequence according to the burst order information signal BOI to generate the first to eighth burst data BD<1:8>, in response to the read mode signal RMD having a logic "low" level. For example, as illustrated in FIG. 17, if an alignment sequence of the first to eighth internal data ID<1:8> is changed, the first internal datum ID<1> may be outputted as the third burst datum BD<3>, the second internal datum ID<2> may be outputted as the fourth burst datum BD<4>, the third internal datum ID<3> may be outputted as the first burst datum BD<1>, the fourth internal datum ID<4> may be outputted as the second burst datum BD<2>, the fifth internal datum ID<5> may be outputted as the seventh burst datum BD<7>, the sixth internal datum ID<6> may be outputted as the eighth burst datum BD<8>, the seventh internal datum ID<7> may be outputted as the fifth burst datum BD<5>, and the eighth internal datum ID<8> may be outputted as the sixth burst datum BD<6>.

The synthesis circuit 622 may output the fourth burst datum BD<4> as the seventh read alignment datum RAD<7> after outputting the third burst datum BD<3> as the fifth read alignment datum RAD<5>, in response to the read mode signal RMD having a logic "low" level. The synthesis circuit 622 may output the second burst datum BD<2> as the third read alignment datum RAD<3> after outputting the first burst datum BD<1> as the first read alignment datum RAD<1>, in response to the read mode signal RMD having a logic "low" level. The synthesis circuit 622 may output the eighth burst datum BD<8> as the eighth read alignment datum RAD<8> after outputting the seventh burst datum BD<7> as the sixth read alignment datum RAD<6>, in response to the read mode signal RMD having a logic "low" level. The synthesis circuit 622 may output the sixth burst datum BD<6> as the fourth read alignment datum RAD<4> after outputting the fifth burst datum BD<5> as the second read alignment datum RAD<2>, in response to the read mode signal RMD having a logic "low" level. In such a case, the first read alignment datum RAD<1> and the second read alignment datum RAD<2> may be sequentially outputted in series, the third read alignment datum RAD<3> and the fourth read alignment datum RAD<4> may be sequentially outputted in series, the fifth read alignment datum RAD<5> and the sixth read alignment datum RAD<6> may be sequentially outputted in series, and the seventh read alignment datum RAD<7> and the eighth read alignment datum RAD<8> may be sequentially outputted in series.

Referring again to FIG. 17, an operation for generating the first to eighth read data RD<1:8> from the first to eighth read alignment data RAD<1:8> will be described hereinafter where the read command RD is inputted to the read control circuit 60 at a time that the third internal clock signal ICLK<3> is generated.

At time "T31", the driver DRV13 may be synchronized with a rising edge of the third internal clock signal ICLK<3> to drive the first read datum RD<1>, in response to the fifth read alignment datum RAD<5>.

At time "T32", the driver DRV14 may be synchronized with a rising edge of the fourth internal clock signal ICLK<4> to drive the second read datum RD<2>, in response to the seventh read alignment datum RAD<7>.

At time "T33", the driver DRV11 may be synchronized with a rising edge of the first internal clock signal ICLK<1> to drive the third read datum RD<3>, in response to the first read alignment datum RAD<1>.

At time "T34", the driver DRV12 may be synchronized with a rising edge of the second internal clock signal ICLK<2> to drive the fourth read datum RD<4>, in response to the third read alignment datum RAD<3>.

At time "T35", the driver DRV13 may be synchronized with a rising edge of the third internal clock signal ICLK<3> to drive the fifth read datum RD<5>, in response to the sixth read alignment datum RAD<6>.

At time "T36", the driver DRV14 may be synchronized with a rising edge of the fourth internal clock signal ICLK<4> to drive the sixth read datum RD<6>, in response to the eighth read alignment datum RAD<8>.

At time "T37", the driver DRV11 may be synchronized with a rising edge of the first internal clock signal ICLK<1> to drive the seventh read datum RD<7>, in response to the second read alignment datum RAD<2>.

At time "T38", the driver DRV12 may be synchronized with a rising edge of the second internal clock signal ICLK<2> to drive the eighth read datum RD<8>, in response to the fourth read alignment datum RAD<4>.

Figure 17:
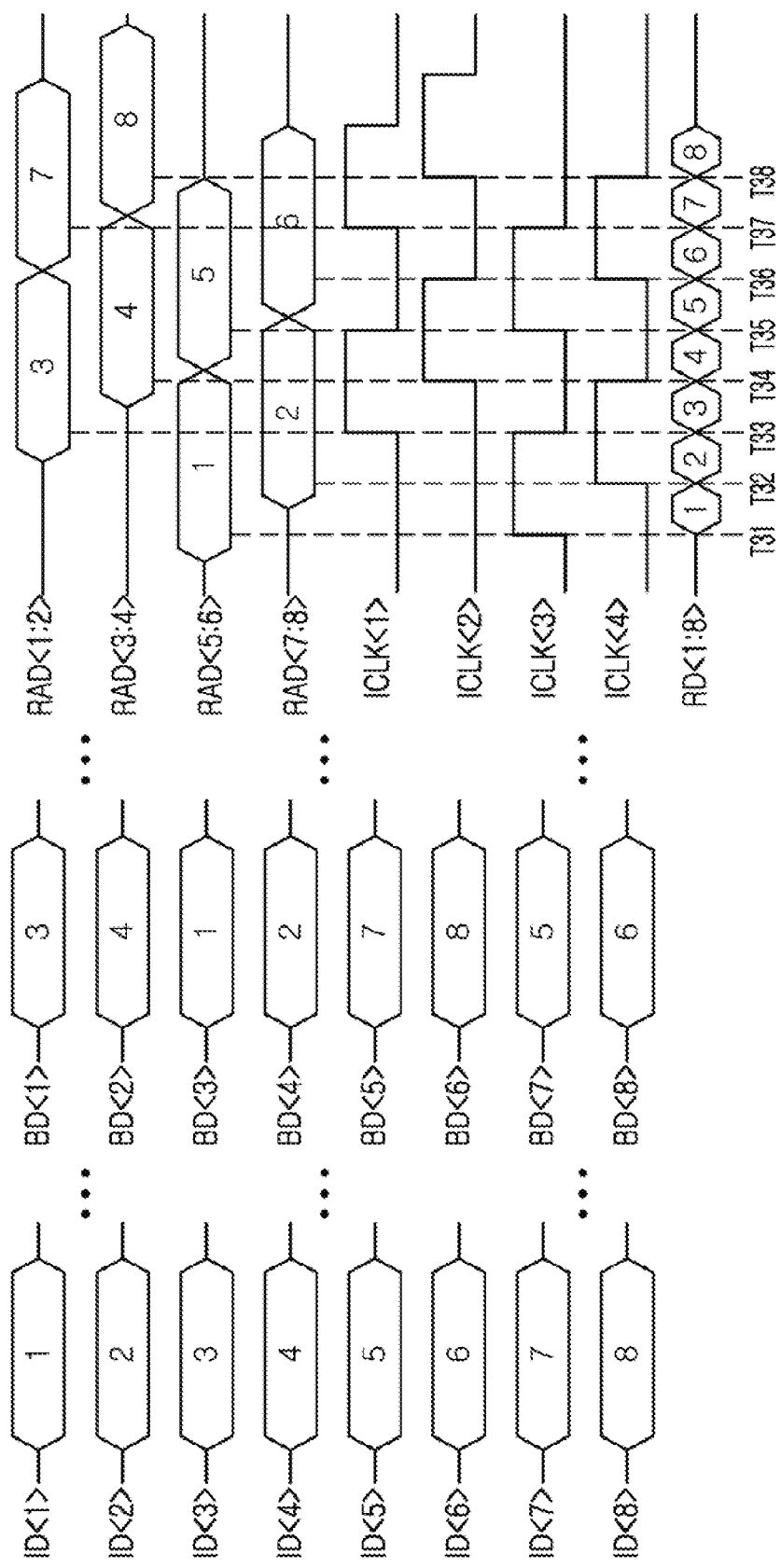

In FIG. 17, the natural numbers of "1" to "8" described in waveforms of the first to eighth burst data BD<1:8>, the first to eighth read alignment data RAD<1:8> and the first to eighth read data RD<1:8> mean the bit numbers of the first to eighth internal data ID<1:8> from which the first to eighth burst data BD<1:8>, the first to eighth read alignment data RAD<1:8> and the first to eighth read data RD<1:8> are generated. For example, the third burst datum BD<3> denoted by the natural number of "1" means a datum which is generated from the first datum bit (i.e., the first internal datum ID<1>) among the first to eighth internal data ID<1:8>.

As described above, a semiconductor device according to an embodiment may control an alignment sequence of data without changing a sequence of internal clock signals whose frequencies are divided according to input times of commands, and the data may be transmitted in the controlled alignment sequence to obtain a sufficient valid window of the data.

The semiconductor device described with reference to FIGS. 1 to 17 may be applied to an electronic system that includes a memory system, a graphic system, a computing system, a mobile system, or the like. For example, as illustrated in FIG. 18, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal outputted from the memory controller 1002. The data storage circuit 1001 may include the semiconductor device illustrated in FIG. 1. Meanwhile, the data storage circuit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003.

Figure 18:
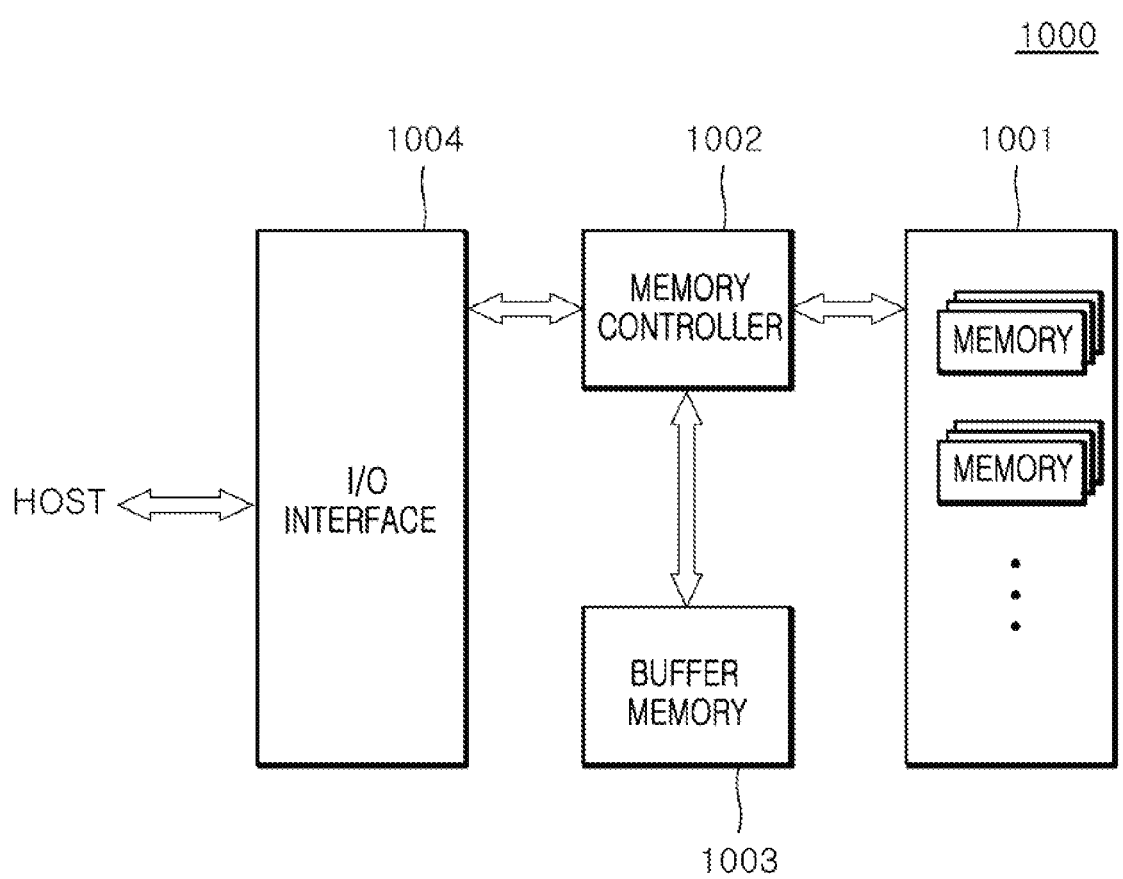
FIG. 18 is a block diagram illustrating a configuration of an electronic system employing the semiconductor device described with reference to FIGS. 1 to 17.

Although FIG. 18 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data to be processed by the memory controller 1002. That is, the buffer memory 1003 may temporarily store data which is outputted from or inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a read mode signal generation circuit configured to compare a read command with at least one of first and third internal clock signals to generate a read mode signal; and
   a read alignment circuit configured to be synchronized with the at least one of first and third internal clock signals to generate read data in response to internal data,
   wherein the read alignment circuit controls an alignment sequence of the internal data in response to the read mode signal, and
   wherein the first and third internal clock signals are distinct from one another.

2. The semiconductor device of claim 1,
   wherein the internal clock signals include first to fourth internal clock signals; and
   wherein the read mode signal is enabled if the read command is inputted to the read mode signal generation circuit at a time that the third internal clock signal is generated.

3. The semiconductor device of claim 1,
wherein the read alignment circuit aligns the internal data in a predetermined sequence to generate the read data if the read mode signal is enabled; and
wherein the read alignment circuit generates the read data without aligning the internal data if the read mode signal is disabled.

4. The semiconductor device of claim 1,
wherein the internal clock signals include first to fourth internal clock signals; and
wherein the first to fourth internal clock signals are obtained by dividing a frequency of an external clock signal to have a phase difference of 90 degrees between the first to fourth internal clock signals.

5. The semiconductor device of claim 1,
wherein the internal data include a plurality of bits that provide parallel data which is simultaneously generated; and
wherein the read data include a plurality of bits that provide serial data which is sequentially generated.

6. The semiconductor device of claim 1,
wherein the internal clock signals include first to fourth internal clock signals; and
wherein the read mode signal generation circuit includes:
a read control signal generation circuit configured to generate a first read control signal which is enabled if the read command is inputted at a time that the first internal clock signal is generated and configured to generate a second read control signal which is enabled if the read command is inputted at a time that the third internal clock signal is generated; and
a read mode signal output circuit configured to generate the read mode signal which is enabled in response to the second read control signal and which is disabled in response to the first read control signal.

7. The semiconductor device of claim 1, wherein the read alignment circuit includes:
an internal read alignment circuit configured to align the internal data in a predetermined sequence to generate read alignment data or configured to generate the read alignment data without aligning the internal data, according to a burst order information signal in response to the read mode signal; and
a read data output circuit configured to be synchronized with the internal clock signals to drive the read data in response to the read alignment data.

8. The semiconductor device of claim 7, wherein the internal read alignment circuit includes:
a burst control circuit configured to align the internal data in a predetermined sequence to generate burst data or configured to generate the burst data without aligning the internal data, according to the burst order information signal in response to the read mode signal; and
a synthesis circuit configured to synthesize the burst data in response to the read mode signal to generate the read alignment data.

9. The semiconductor device of claim 1, further comprising:
a write mode signal generation circuit configured to compare a write command with at least one of the internal clock signals to generate a write mode signal; and
a write alignment circuit configured to be synchronized with the internal clock signals to generate the internal data in response to write data.

10. The semiconductor device of claim 9, wherein the write alignment circuit controls an alignment sequence of the write data in response to the write mode signal.

11. The semiconductor device of claim 9,
wherein the internal clock signals include first to fourth internal clock signals; and
wherein the write mode signal is enabled if the write command is inputted to the write mode signal generation circuit at a time that the third internal clock signal is generated.

12. The semiconductor device of claim 9,
wherein the write alignment circuit aligns the write data in a predetermined sequence to generate the internal data if the write mode signal is enabled; and
wherein the write alignment circuit generates the internal data without aligning the write data if the write mode signal is disabled.

13. The semiconductor device of claim 9,
wherein the internal clock signals include first to fourth internal clock signals; and
wherein the write mode signal generation circuit includes:
a write control signal generation circuit configured to generate a first write control signal which is enabled if the write command is inputted at a time that the first internal clock signal is generated and configured to generate a second write control signal which is enabled if the write command is inputted at a time that the third internal clock signal is generated; and
a write mode signal output circuit configured to generate the write mode signal which is enabled in response to the second write control signal and which is disabled in response to the first write control signal.

14. The semiconductor device of claim 9, wherein the write alignment circuit includes:
an internal write alignment circuit configured to align the write data in a predetermined sequence in synchronization with the internal clock signals to generate write alignment data; and
a write data selection circuit configured to selectively output the write alignment data as the internal data in response to the write mode signal.

* * * * *